US009176496B2

(12) United States Patent
Shibata

(10) Patent No.: US 9,176,496 B2
(45) Date of Patent: Nov. 3, 2015

(54) SUBSTRATE TREATING SYSTEM

(75) Inventor: Hideki Shibata, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 587 days.

(21) Appl. No.: 13/596,984

(22) Filed: Aug. 28, 2012

(65) Prior Publication Data

US 2013/0079914 A1 Mar. 28, 2013

(30) Foreign Application Priority Data

Sep. 26, 2011 (JP) ................................. 2011-208499

(51) Int. Cl.
G05B 19/18 (2006.01)
G05B 19/418 (2006.01)
H01L 21/67 (2006.01)

(52) U.S. Cl.
CPC ........ *G05B 19/41825* (2013.01); *G05B 2219/31216* (2013.01); *G05B 2219/32265* (2013.01); *G05B 2219/45031* (2013.01); *H01L 21/67276* (2013.01)

(58) Field of Classification Search
CPC ....................................................... G05B 19/18
USPC ............... 700/114, 112, 228; 414/222.01
See application file for complete search history.

(56) References Cited

U.S. PATENT DOCUMENTS

| 6,468,021 | B1 | 10/2002 | Bonora et al. ................ 414/522 |
| 7,604,449 | B1 | 10/2009 | Kaveh .......................... 414/411 |
| 8,047,762 | B2 | 11/2011 | Zimmerhackl et al. ....... 414/806 |
| 2004/0247417 | A1 | 12/2004 | Fujimura et al. ........... 414/222.1 |
| 2006/0045662 | A1 | 3/2006 | Aalund et al. |
| 2007/0276529 | A1 | 11/2007 | Brill et al. .................... 700/112 |
| 2009/0016859 | A1 | 1/2009 | Asakawa ................ 414/222.11 |
| 2009/0035101 | A1* | 2/2009 | Zimmerhackl et al. .. 414/222.01 |
| 2009/0202336 | A1 | 8/2009 | Shah et al. .................... 414/806 |
| 2011/0076120 | A1 | 3/2011 | Itou .......................... 414/222.13 |
| 2011/0150607 | A1 | 6/2011 | Hong et al. ............. 414/222.01 |

FOREIGN PATENT DOCUMENTS

| CN | 1333730 A | 1/2002 |
| CN | 1531048 A | 9/2004 |

(Continued)

OTHER PUBLICATIONS

Taiwan Office Action and Search Report dated Sep. 4, 2014 for corresponding Taiwan Patent Application No. 101133111 (10 pages).

(Continued)

*Primary Examiner* — Tejal Gami
(74) *Attorney, Agent, or Firm* — Ostrolenk Faber LLP

(57) ABSTRACT

A substrate treating apparatus having a substrate treating unit, a load port for receiving pods for storing the substrates, and transferring the pods to and from the substrate treating unit, and a buffer between the substrate treating unit and the load port for transferring the substrates to and from the substrate treating unit and the load port, and temporarily storing the pods; a carrier transport system for transferring the pods to and from the load port; and a host computer for transporting the pods in response to conditions. A transport-related control unit, when the load port is being used by one of the pods and a vehicle of the carrier transport system approaches to transfer another of the pods to the load port, to suspends a notice of transfer disapproval until completion of the use by the one of the pods.

17 Claims, 21 Drawing Sheets

(56) References Cited

FOREIGN PATENT DOCUMENTS

| | | |
|---|---|---|
| CN | 1736831 A | 2/2006 |
| CN | 101048327 A | 10/2007 |
| CN | 102034731 | 4/2011 |
| CN | 102138209 | 7/2011 |
| DE | 10 2007 035 839 A1 | 2/2009 |
| JP | 2000-148243 | 5/2000 |
| JP | 2002-246432 | 8/2002 |
| JP | 2008-508731 | 3/2008 |
| JP | 2009-135275 | 6/2009 |
| KR | 10-2010-0024220 | 3/2010 |
| KR | 10-2010-0129152 | 12/2010 |

OTHER PUBLICATIONS

Chinese Office Action and Search Report dated Jul. 31, 2014 for corresponding Chinese Patent Application No. 201210347581.7 (5 pages).

Korean Notice of Allowance dated Apr. 24, 2014 for corresponding Korean Patent Application No. 10-2012-0106192 (2 pages).

* cited by examiner

MOVE TO APPARATUS

SUSPEND LOADING REQUEST
(TURNING ON OF L_REQ SIGNAL)

SUBSTRATE TREATING SYSTEM

BACKGROUND OF THE INVENTION (1) Field of the Invention

This invention relates to a substrate treating system for transporting, to and from a substrate treating apparatus, pods containing semiconductor wafers, substrates for liquid crystal displays, substrates for plasma displays, substrates for organic EL devices, substrates for FEDs (Field Emission Displays), substrates for optical displays, substrates for magnetic disks, substrates for magnetic optical disks, substrates for photomasks, or substrates for solar cells (hereinafter called simply substrates).

(2) Description of the Related Art

Conventionally, a substrate treating system of this type includes a substrate treating apparatus having a substrate treating unit, a pod storage and transport unit, and a load port, and a carrier transport system for transporting pods upon instructions of a host computer which performs overall control of the treating system.

The substrate treating unit carries out various types of treatment for substrates. The pod storage and transport unit is juxtaposed to the substrate treating unit for storing and transporting FOUPs (Front Opening Unified Pods) containing the substrates. The load port is juxtaposed to the pod storage and transport unit for receiving the FOUPs. The carrier transport system is an automated material handling system (AMHS) having automatic guided vehicles (AGV), or an overhead hoist transfer (OHT), which transfers the FOUPs to and from the load port. The host computer carries out controls relating to transportation of the FOUPs through communication with the substrate treating apparatus and the carrier transport system It takes time for the carrier transport system to transport the FOUPs to the substrate treating apparatus. Therefore, where the substrate treating apparatus has the pod storage and transport unit, it is required, after a FOUP is loaded into the load port, to take the FOUP from the load port into the pod storage and transport unit as soon as possible, to vacate the load port for receiving a next FOUP. In order to meet such a requirement, a proposal has been made to provide a movable buffer as a temporary passing place for pods adjacent the load port. See Japanese Patent National Publication No. 2008-508731, for example.

This apparatus, when a FOUP is placed on the load port, operates the movable buffer to slide the FOUP side-ways for temporary displacement from the load port, thereby making the load port available for a next transporting action.

However, the conventional example with such construction has the following drawback.

Although the conventional apparatus has the mechanism for temporarily displacing FOUPs from the load port, an inconvenience occurs when, for example, two OHTs of the carrier transport system consecutively carry FOUPs to the same load port. Since the loading intervals are short, there occurs a problem that, before the FOUP loaded by one OHT into the load port is displaced therefrom, the other OHT may attempt and fail to load the other FOUP into the load port. Immediately upon such loading failure, the load port reports "loading disapproval" for that OHT to the carrier transport system. Then, the OHT will move past the load port and along a circulating track of the carrier transport system, and will thereafter make a loading attempt again. The same problem may arise in unloading. Therefore, moving along the circulating track is time-consuming, which poses a problem that the resources of the carrier transport system cannot be used effectively.

SUMMARY OF THE INVENTION

This invention has been made having regard to the state of the art noted above, and its object is to provide a substrate treating system which can use a carrier transport system effectively.

The above object is fulfilled, according to this invention, by a substrate treating system comprising a substrate treating apparatus having a substrate treating unit for carrying out predetermined treatments of substrates, a load port with physical load ports for receiving pods for storing the substrates, the load port transferring the pods to and from the substrate treating unit, and an internal buffer interposed between the substrate treating unit and the load port for transferring the substrates to and from the substrate treating unit, transferring the pods to and from the load port, and temporarily storing the pods in time of transfer; a carrier transport system for transferring the pods to and from the load port; and a host computer for communicating with the substrate treating apparatus and the carrier transport system, and instructing the carrier transport system to transport the pods according to a situation of the substrate treating apparatus; wherein the substrate treating apparatus includes a transport-related control unit arranged, when the load port is being used by one of the pods and a vehicle of the carrier transport system approaches to transfer another of the pods to the load port, to suspend a notice of transfer disapproval until completion of the use by the one of the pods.

According to this invention, the substrate treating apparatus has the transport-related control unit which, when the carrier transport system has moved onward to load a pod into the load port but a different pod is present on the load port, and even if the carrier transport system notifies a start of transportation, will not give a loading propriety notice to the carrier transport system but keep the transport system on standby until completion of transportation of the pod to the internal buffer. Therefore, even when a next vehicle transports a pod after a preceding vehicle, the next vehicle will not move along the circulating track unnecessarily. As a result, the carrier transport system can be used effectively in loading the pods.

In this invention, the carrier transport system may be arranged, when, in time of loading, a different one of the pods is present on the load port, to stand by in a current position until permission for loading is obtained from the transport-related control unit.

Generally, the carrier transport system, upon lapse of a predetermined time after notifying a start of transportation, would leave the place and return to the circulating track. However, the carrier transport system stands by in the current position until permission for loading is obtained from the transport-related control unit, thereby eliminating wasteful circulating movement.

The substrate treating apparatus may further include a host-related control unit arranged, when instructed by the host computer to unload a pod in the internal buffer, to report to the host computer that the pod is ready for unloading, during a period of time from a start of transportation of the pod from the internal buffer to the load port until the pod is placed on the load port.

During a period of time from when the substrate treating apparatus begins to deliver a pod to the load port until the pod is placed on the load port, the host-related control unit reports to the host computer that the pod is ready to be unloaded.

Therefore, compared with the case of giving an unload ready report after the pod is actually placed on the load port, the time can be advanced for starting movement of the carrier transport system. As a result, the carrier transport system can be used effectively in unloading the pods.

The carrier transport system may be arranged, when the vehicle has moved to unload the pod but fails to find the pod on the load port, to cause the vehicle to stand by in a current position until the pod is placed on the load port.

Generally, when the carrier transport system moved onward to unload a pod but found the load port having no pod placed thereon, the carrier transport system would return to the circulating track. However, the carrier transport system stands by until the pod is placed on the load port, thereby eliminating wasteful circulating movement.

In another aspect of this invention, there is provided a substrate treating system comprising a substrate treating apparatus having a substrate treating unit for carrying out predetermined treatments of substrates, a load port with physical load ports for receiving pods for storing the substrates, the load port transferring the pods to and from the substrate treating unit, and an internal buffer interposed between the substrate treating unit and the load port for transferring the substrates to and from the substrate treating unit, transferring the pods to and from the load port, and temporarily storing the pods in time of transfer; a carrier transport system for transferring the pods to and from the load port; and a host computer for communicating with the substrate treating apparatus and the carrier transport system, and instructing the carrier transport system to transport the pods according to a situation of the substrate treating apparatus; wherein the substrate treating apparatus includes a host-related control unit arranged, when instructed by the host computer to unload a pod in the internal buffer, to report to the host computer that the pod is ready for unloading, during a period of time from a start of transportation of the pod from the internal buffer to the load port until the pod is placed on the load port.

According to this invention, when instructed by the host computer to unload a pod in the internal buffer, a report that the pod is ready for unloading is given to the host computer by the time the pod is placed on the load port. Therefore, a vehicle of the carrier transport system can move to and arrive at the load port quickly, thereby to unload the pod at an early time.

In this invention, the substrate treating system may further comprise a virtual load port control device for allotting virtual load ports to the physical load ports, and instructing the carrier transport system to perform a transporting operation to and from the virtual load ports on an assumption that the virtual load ports really exist.

This construction enables a plurality of vehicles to transport a plurality of pods at the same to one physical load port. Thus, a large number of pods can be transported efficiently.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

Figure 1:
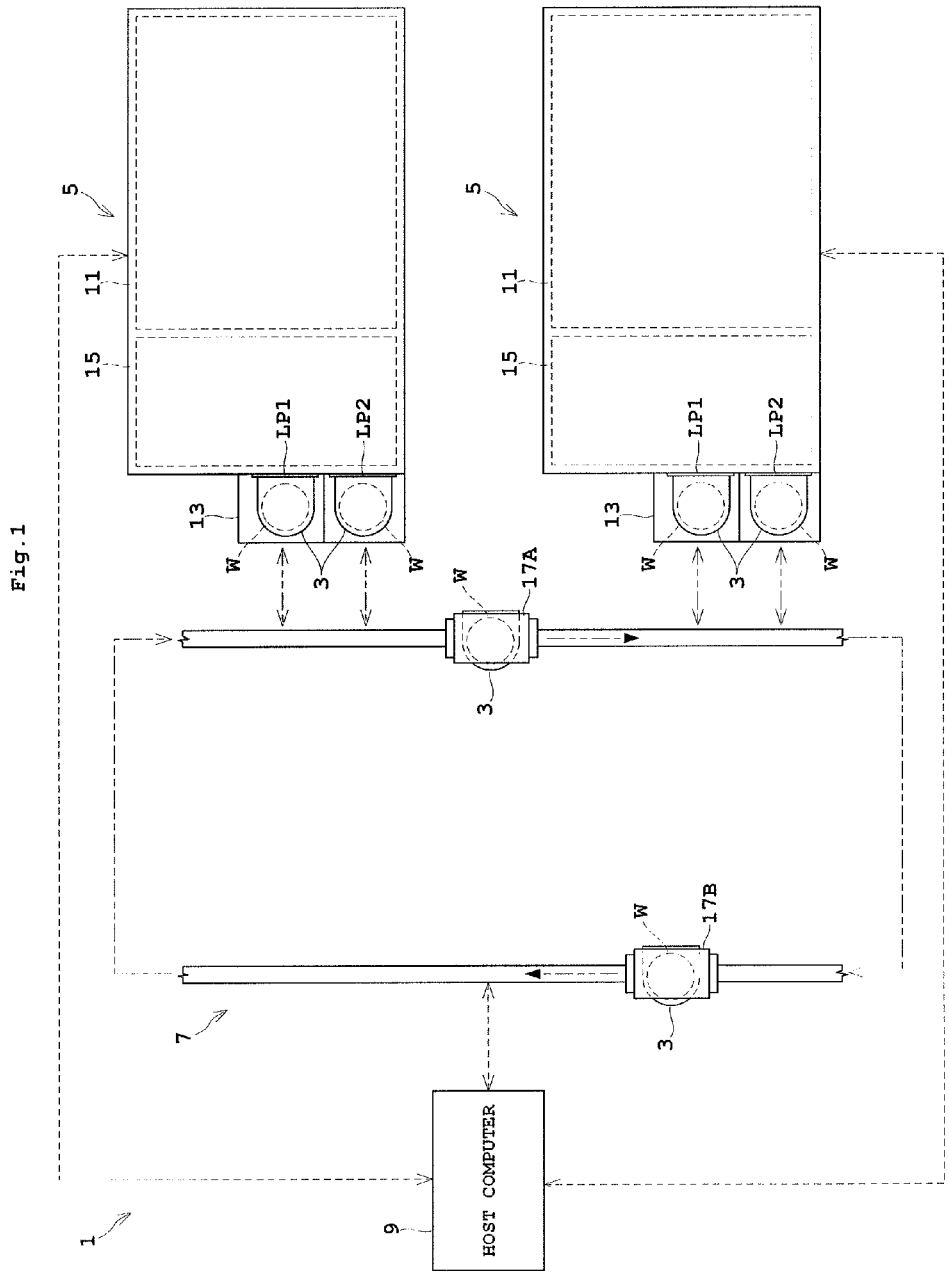
FIG. 1 is a plan view showing an outline of a substrate treating system according to this invention.
Figure 2:
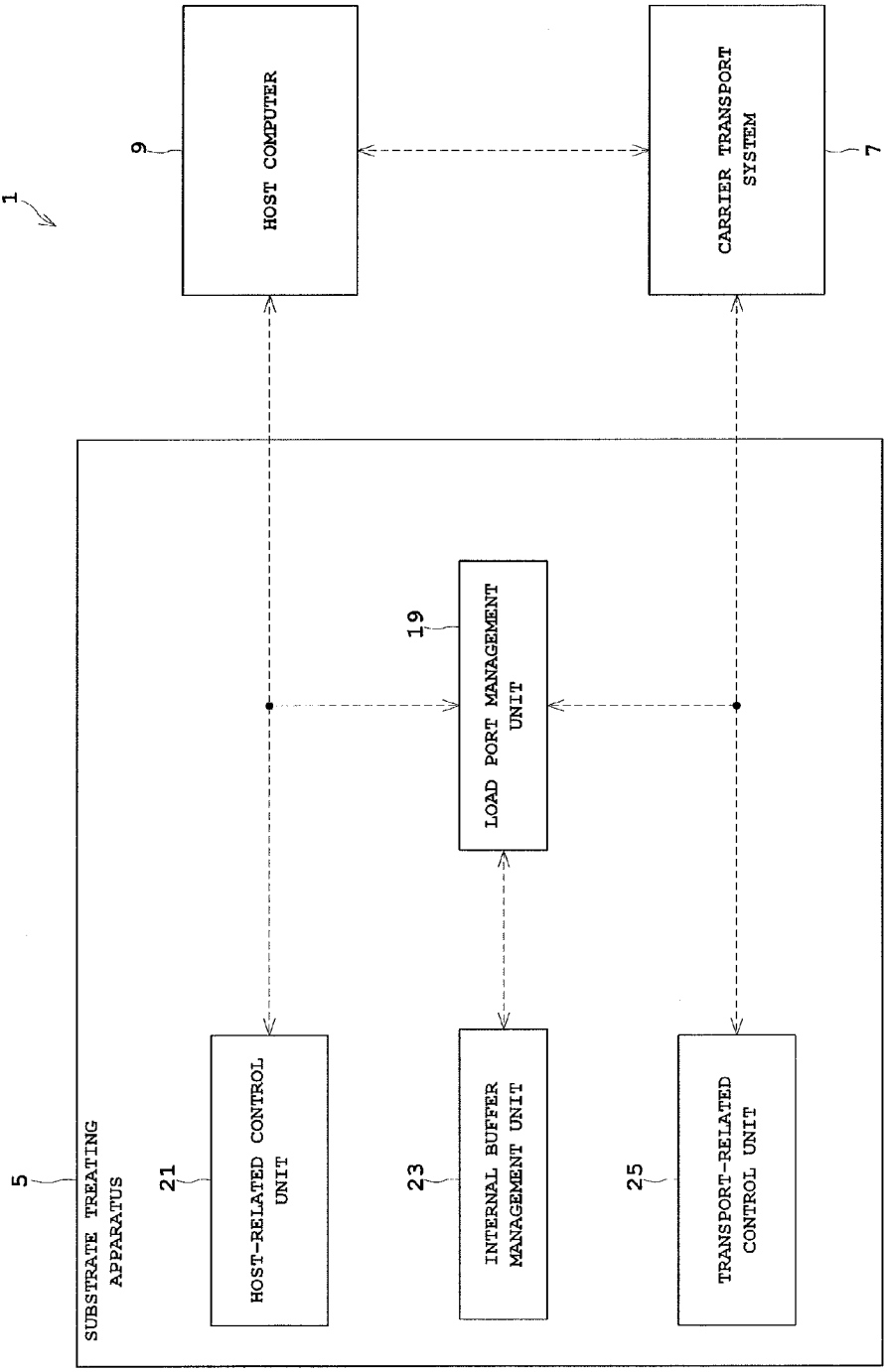
FIG. 2 is a block diagram showing an outline construction of the substrate treating system.

FIG. 1 is a plan view showing an outline of a substrate treating system according to this invention. FIG. 2 is a block diagram showing an outline construction of the substrate treating system.

This substrate treating system 1 has functions to receive wafers W along with FOUPs 3, treat the wafers W and deliver the treated wafers W along with the FOUPs 3. FOUP is an abbreviation of Front Opening Unified Pod, and the FOUPs 3 store wafers W in a sealed condition to secure clean environment.

The substrate treating system 1 includes substrate treating apparatus 5, a carrier transport system 7, and a host computer 9, for example. It is general practice to provide a plurality of substrate treating apparatus 5, and FIG. 1 shows two substrate treating apparatus 5 by way of example.

Each substrate treating apparatus 5 has a substrate treating unit 11, a load port 13, and an internal buffer 15. The substrate treating unit 11 carries out predetermined treatments of the wafers W taken out of the FOUPs 3. The predetermined treatments include cleaning treatment, etching treatment, and photoresist removing treatment, for example. The load port 13 serves for transferring the FOUPs 3 between the substrate treating apparatus 5 and the carrier transport system 7. In this example, the load port 13 includes two physical load ports LP1 and LP2. The internal buffer 15 is disposed between the substrate treating unit 11 and the load port 13 for transferring FOUPs 3 to and from the load port 13, and transferring the wafers W taken out of the FOUPs 3 to and from the substrate treating unit 11. The internal buffer 15 has a buffering function to store temporarily the FOUPs 3 loaded from the load port 13 when the substrate treating unit 11 is in a state not capable of accepting the wafers W, and store temporarily the FOUPs 3 when the load port 13 is in a state not capable of accepting delivery of the FOUPs 3.

The above FOUPs 3 correspond to the "pods" in this invention.

The carrier transport system 7 transports FOUPs 3 to and from the substrate treating apparatus 5, or between a depository, not shown, of FOUPs 3, and the substrate treating apparatus 5. The carrier transport system 7 may be AMHS (Automated Material Handling Systems) having vehicles such as AGVs (Automatic Guided Vehicles) or OHT (Overhead Hoist Transfer), for example. This embodiment employs a construction, as an example, in which OHTs 17 circulate in an area adjacent the two substrate treating apparatus 5. There are two OHTs 17 acting as vehicles in this example, which are referenced OHT 17A and OHT 17B.

The host computer 9 communicates with the substrate treating apparatus 5 and carrier transport system 7 described above. The host computer 9 instructs for transportation of the FOUPs 3 by the carrier transport system 7 according to situations of the substrate treating apparatus 5. The "transportation" here refers to "loading" which is transportation for carrying the FOUPs 3 into the substrate treating apparatus 5, and "unloading" which is transportation for carrying the FOUPs 3 out of the substrate treating apparatus 5.

As shown in FIG. 2, the above substrate treating apparatus 5 includes a load port management unit 19. The load port management unit 19 determines states of the two physical load ports LP1 and LP2, and has communication between the carrier transport system 7 and host computer 9. The load port management unit 19 also performs processes such as allotting the physical load port LP1 to loading, and the physical load port LP2 to unloading.

The substrate treating apparatus 5 includes a host-related control unit 21, an internal buffer management unit 23, and a transport-related control unit 25. The host-related control unit 21 mainly performs communication with the host computers 9. The internal buffer management unit 23 determines use states and the like of the internal buffer 15, and determines which racks FOUPs 3 should be stored on and which racks FOUPs 3 should be unloaded from. The transport-related control unit 25 communicates with the carrier transport system 7.

The transport-related control unit 25 controls loading in response to varied conditions as described in detail hereinafter. When, for example, the carrier transport system 7 moves onward to load a FOUP 3 into the load port 13, even if a determination is made based on a management situation of the load port 13 by the load port management unit 19 that a different FOUP 3 is placed on the load port 13, i.e. a transfer from the load port 13 to the internal buffer 15 is not completed yet, the transport-related control unit 25 suspends a loading disapproval notice to the carrier transport system 7 until the different FOUP 3 has been transported to the internal buffer 15. When, at this time, the OHT 17B moves onward for loading purposes, following the OHT 17A of the carrier transport system 7, for example, the aftercoming OHT 17B, unless particular conditions are met, stands by on the spot until permission for loading is given by the transport-related control unit 25.

The host-related control unit 21 controls unloading in response to varied conditions as described in detail hereinafter. When, for example, unloading of a FOUP 3 in the internal buffer 15 is instructed by the host computer 9, based on a management situation by the load port management unit 19, the FOUP 3 is transported from the internal buffer 15 to either one of the physical load ports LP1 and LP2 of the load port 13. During a period after starting the transportation and until the FOUP 3 is placed on the physical load port LP1 or LP2, i.e. while the load port 13 is in use by the FOUP 3, a report is sent to the host computer 9 that the FOUP 3 can be unloaded.

When, at this time, the carrier transport system 7 moves onward to unload the FOUP 3 but the FOUP 3 is placed on neither of the physical load ports LP1 and LP2 of the load port 13, i.e. a state that the transfer from the internal buffer 15 to the load port 13 is not completed, the carrier transport system 7 stands by on the sport since a notice of transfer propriety is suspended.

<Loading Process>

Next, a flow of "loading" of the FOUPs 3 by the above substrate treating system 1 will be described with reference to FIGS. 3-11.

Figure 3:
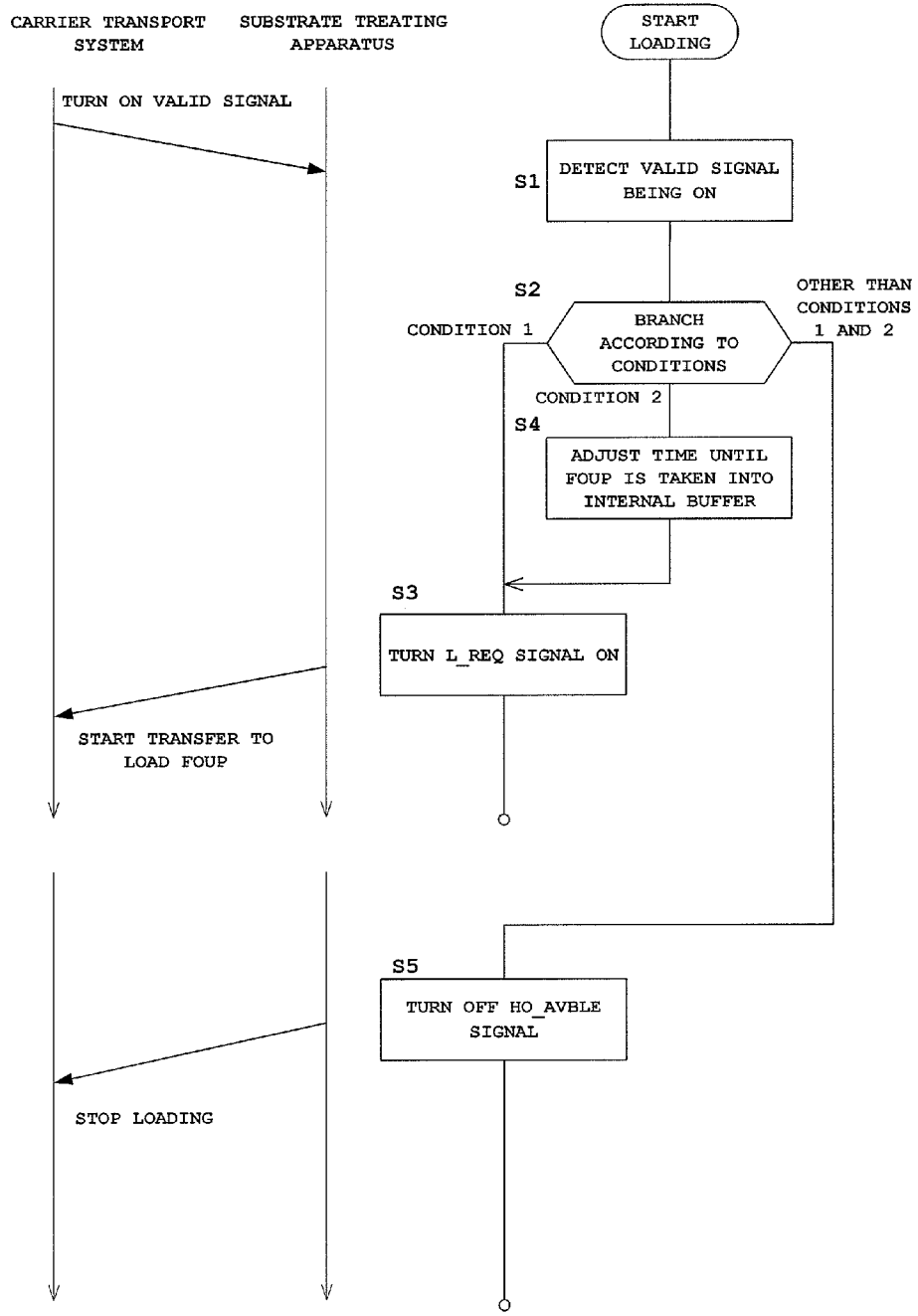
FIG. 3 is a time chart and flow chart showing a sequence of a loading process.
Figure 4:
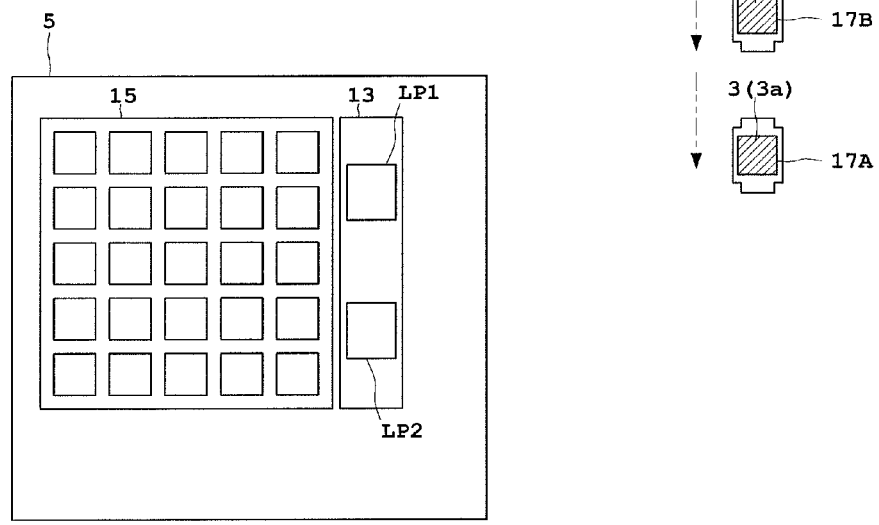
FIG. 4 is a schematic view showing the loading process and a state of a carrier transport system.
Figure 5:
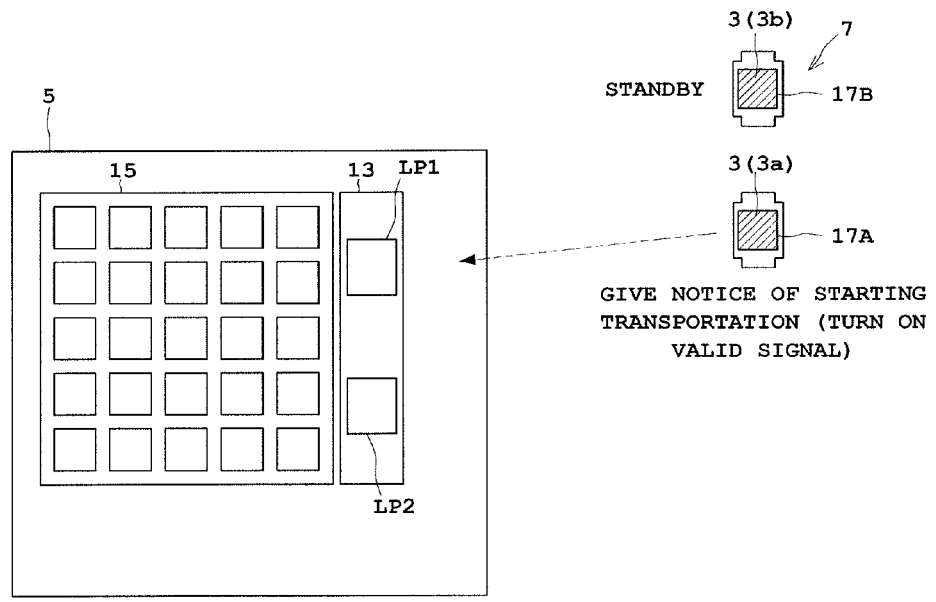
FIG. 5 is a schematic view showing the loading process and a transport start notice to the substrate treating apparatus.
Figure 6:
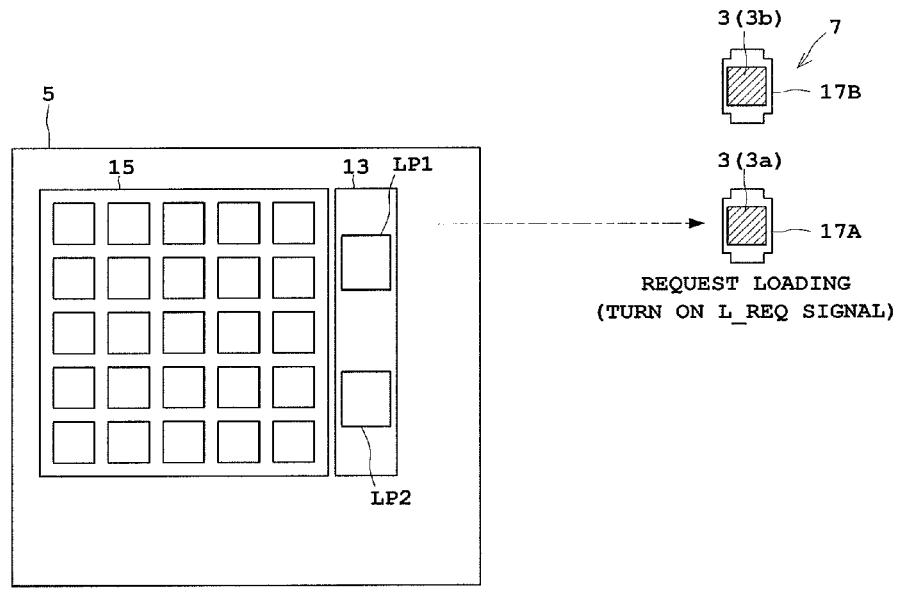
FIG. 6 is a schematic view showing the loading process and a notice to the carrier transport system.
Figure 7:
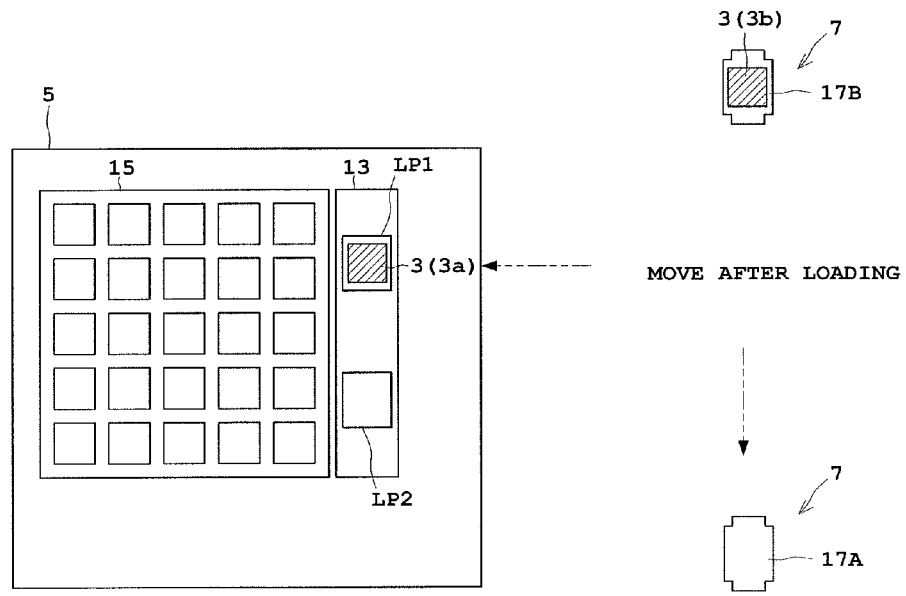
FIG. 7 is a schematic view showing the loading process and a loading into a load port.
Figure 8:
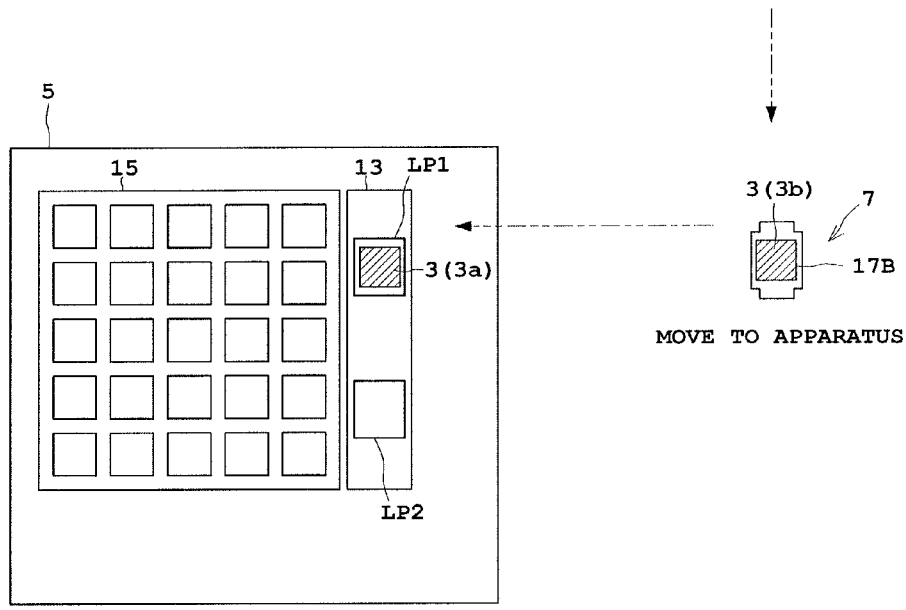
FIG. 8 is a schematic view showing the loading process and a transport start notice by a next carrier transport system.
Figure 9:
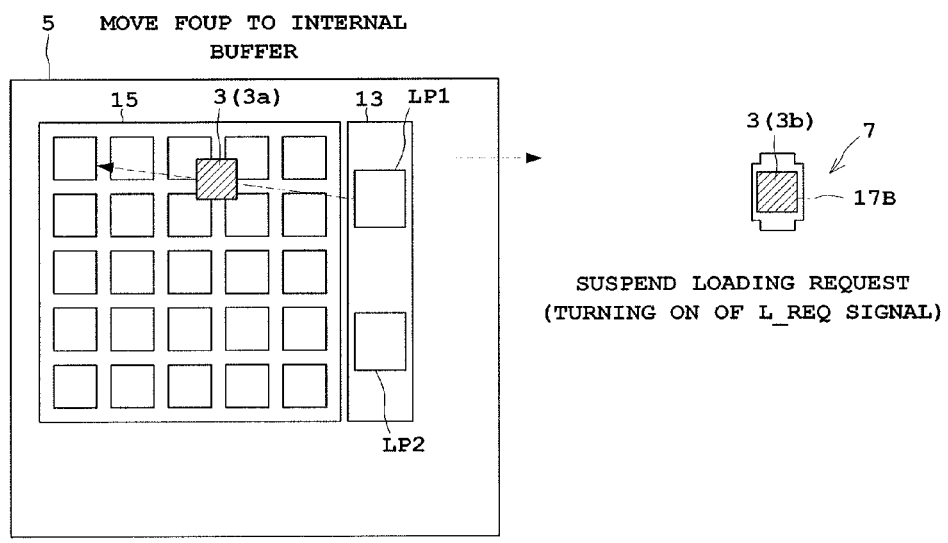
FIG. 9 is a schematic view showing the loading process and suspension of a load request.
Figure 10:
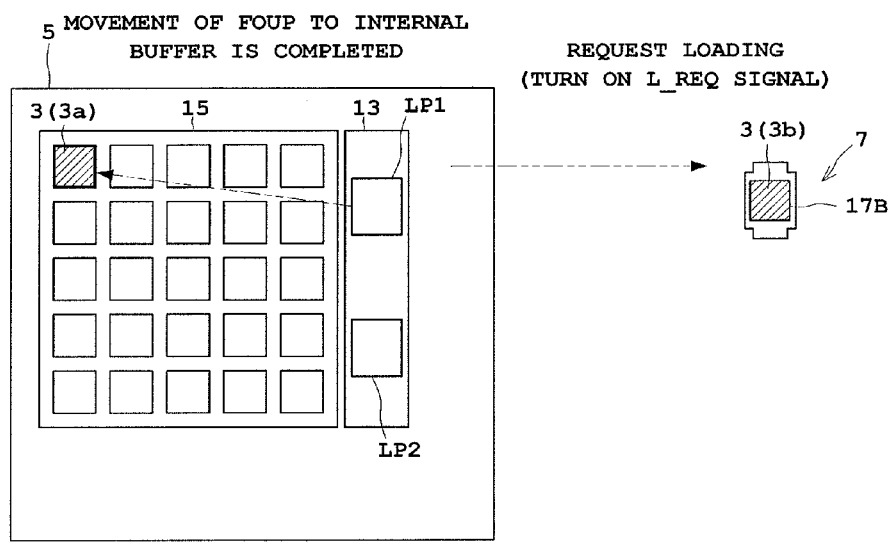
FIG. 10 is a schematic view showing the loading process and a notice of load request.
Figure 11:
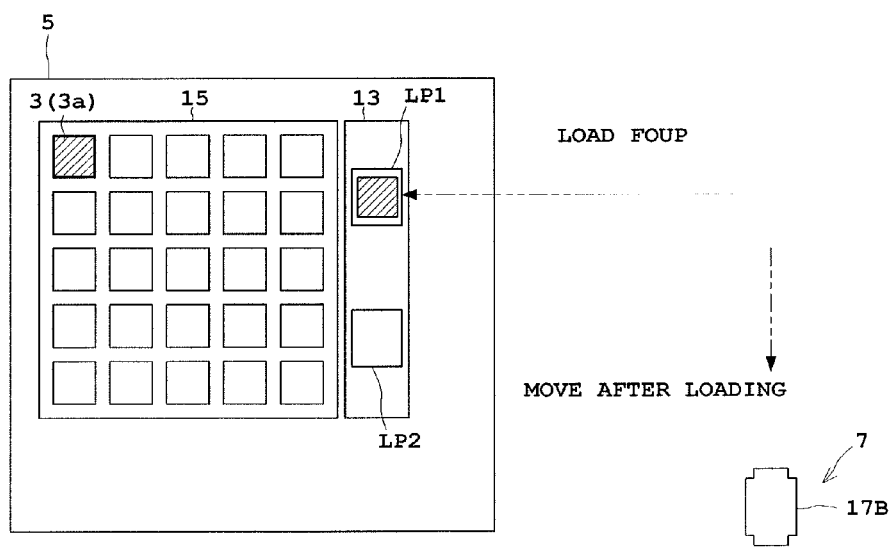
FIG. 11 is a schematic view showing the loading process and a loading into the load port.

FIG. 3 is a time chart and flow chart showing a sequence of a loading process. FIGS. 4-11 are schematic views showing the loading process. FIG. 4 shows a state of the carrier transport system. FIG. 5 shows a transport start notice to the substrate treating apparatus. FIG. 6 shows a notice to the carrier transport system. FIG. 7 shows a loading into the load port. FIG. 8 shows a transport start notice by a next carrier transport system. FIG. 9 shows suspension of a load request. FIG. 10 shows a notice of load request. FIG. 11 shows a loading into the load port.

In the following description, it is assumed that, as shown in FIG. 4, the OHT 17A of the carrier transport system 7 holding a FOUP 3a, and the OHT 17B holding a FOUP 3b, have moved in this order to the substrate treating apparatus 5, and are waiting for a loading process.

The carrier transport system 7 turns on a VALD signal to the transport-related control unit 25 of the substrate treating apparatus 5 (FIG. 5). This VALD signal is a signal indicating a start of transportation. The transport-related control unit 25 of the substrate treating apparatus 5 detects the VALD signal being ON (step S1). It is assumed in this example that the OHT 17A which is the preceding one of the two OHTs 17A and 17B has turned on the VALD signal.

The transport-related control unit 25 branches the process according to conditions, taking a situation by the load port management unit 19 into consideration (step S2). "Condition 1" is that loading is possible. If loading is possible, an L_REQ signal is turned on. This L_REQ signal means that loading is permitted. On the other hand, "Condition 2" is a case where the load port 13 is in use, or a FOUP 3 is being transported from there to the internal buffer 15. That is, strictly speaking, the load port 13 is not available. "Condition 3" corresponds to a situation other than conditions 1 and 2. This includes a case where, for example, the load port 13 is out of order and unusable.

Here, for the first OHT 17A, the load port 13 is vacant, and so condition 1 is met. Therefore, as shown in FIG. 6, the transport-related control unit 25 turns on the L_REQ signal for the OHT 17A to the carrier transport system 7 (step S3). This L_REQ signal signifies Load REQuest referring to a load request. The OHT 17A of the carrier transport system 7 having received the load request performs a transfer operation to place the FOUP 3a on the physical load port LP1 (FIG. 7). Then, the OHT 17A leaves the place and returns to a circulating track of the carrier transport system 7.

Next, the OHT 17B moves before the substrate treating apparatus 5, and turns on a VALD signal indicating a start of transportation for the transport-related control unit 25 (FIG. 8). At this time, the preceding FOUP 3a is present on the physical load port LP1.

The internal buffer management unit 23 starts moving the FOUP 3a to an appropriate rack of the internal buffer 15, taking the use situation of the internal buffer 15 into consideration (FIG. 9). At this time, generally, the transport-related control unit 25 would give a load request in response to the VALD signal. In this invention, a load request to the carrier transport system 7 is suspended, and also a loading disapproval notice is not given immediately. This is because the movement of the preceding FOUP 3a has just started and the load port 13 cannot be used. Specifically, since condition 2 in step S2 of FIG. 3 is met, the operation moves from step S2 to step S4 for time adjustment. In particular, the transport-related control unit 25 waits for a movement completion notice from the internal buffer management unit 23, before sending a load request to the carrier transport system 7 (FIG. 10). Upon receipt of the load request, the carrier transport system 7 causes the OHT 17B to transfer the FOUP 3b to the physical load port LP1 (FIG. 11). Having finished the transfer, the OHT 17B returns to the circulating track.

When condition 3 noted above is met, an HO_AVBLE signal is turned off (step S5) to stop the loading process. Since the loading is stopped by this, the carrier transport system 7 returns the OHT 17 having moved and standing by before the substrate treating apparatus 5 to the circulating track. This can avoid the inconvenience of the OHT 17 remaining on standby before the substrate treating apparatus 5.

Thus, the substrate treating apparatus 5 has the transport-related control unit 25 which, when the carrier transport system 7 has moved onward to load a FOUP 3 into the load port 13 but a different FOUP 3a is present on the load port 13, and even if the carrier transport system 7 notifies a start of transportation, will not give a loading propriety notice to the carrier transport system 7 but keep it on standby until completion of transportation of the FOUP 3a to the internal buffer 15. Therefore, even when the next OHT 17B transports a FOUP 3b after the preceding OHT 17A, the following OHT 17B will not move along the circulating track unnecessarily. As a result, the carrier transport system 7 can be used effectively in loading the FOUPs 3.

When a different FOUP 3 is present on the load port 13 at a loading time, the carrier transport system 7 will stand by on the spot until permission for loading is received from the transport-related control unit 25, and thus will not move along the circulating track in vain. For this purpose, it is preferable to change the value of a timer provided for the carrier transport system 7. Specifically, the value of a timer which clocks a waiting time from a request for loading start (turning on of the VALD signal) to a load request (turning on of the L_REQ signal) may be changed, for example, from a typical about 2 seconds to about 10 seconds. This is a time taken in transporting a FOUP 3 from the load port 13 to the internal buffer 15. A slightly longer time may be set considering a safety margin, as long as this is substantially a time needed for the transportation.

<Unloading Process>

Next, a flow of "unloading" of the FOUPs 3 by the above substrate treating system 1 will be described with reference to FIGS. 12-20.

Figure 12:
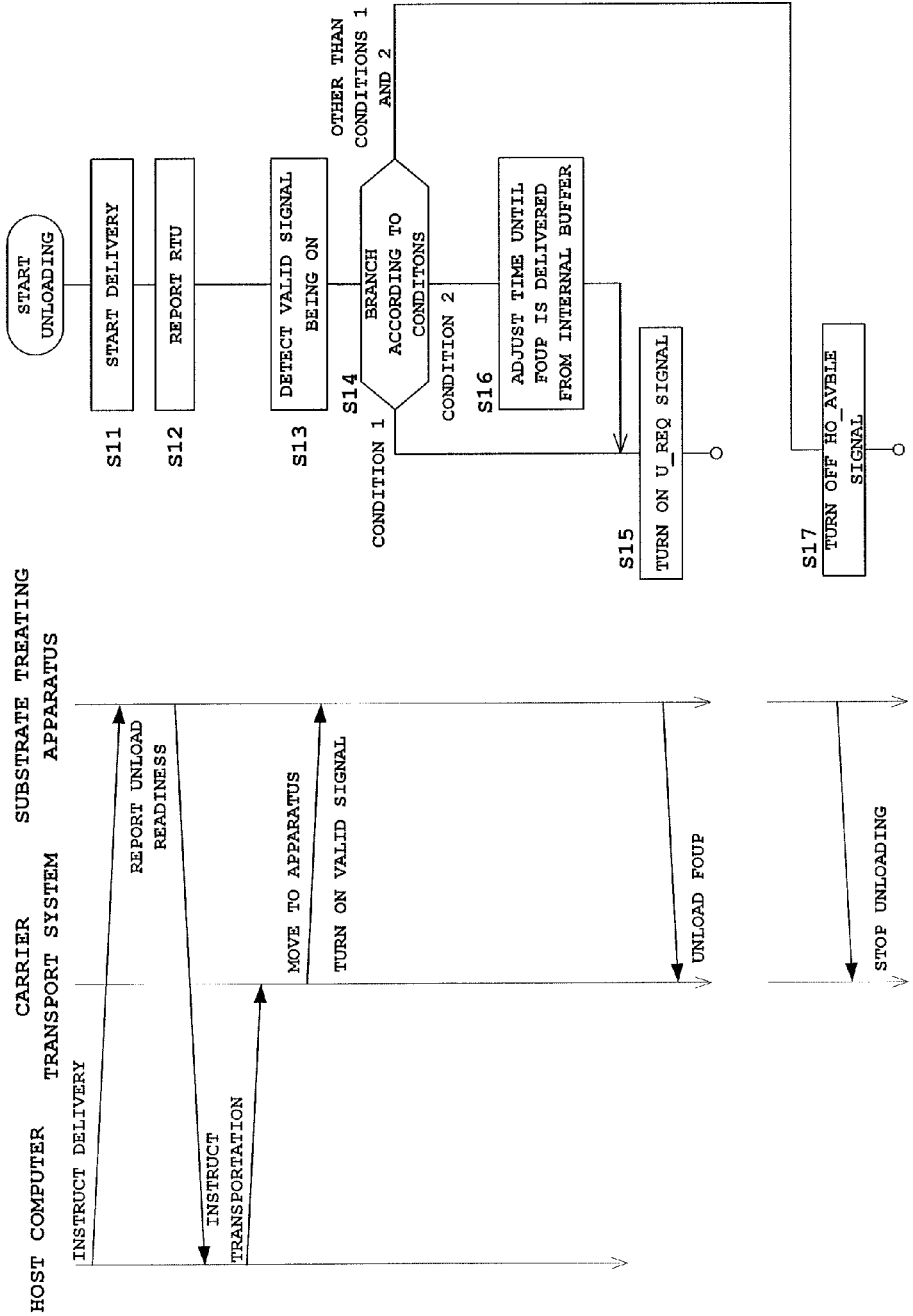
FIG. 12 is a time chart and flow chart showing a sequence of an unloading process.
Figure 13:
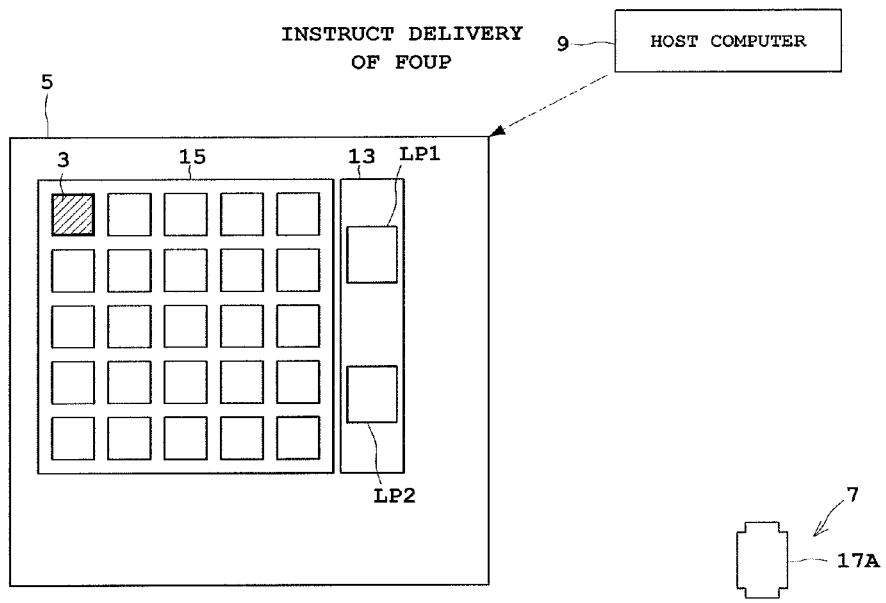
FIG. 13 is a schematic view showing the unloading process and delivery instructions to the substrate treating apparatus.
Figure 14:
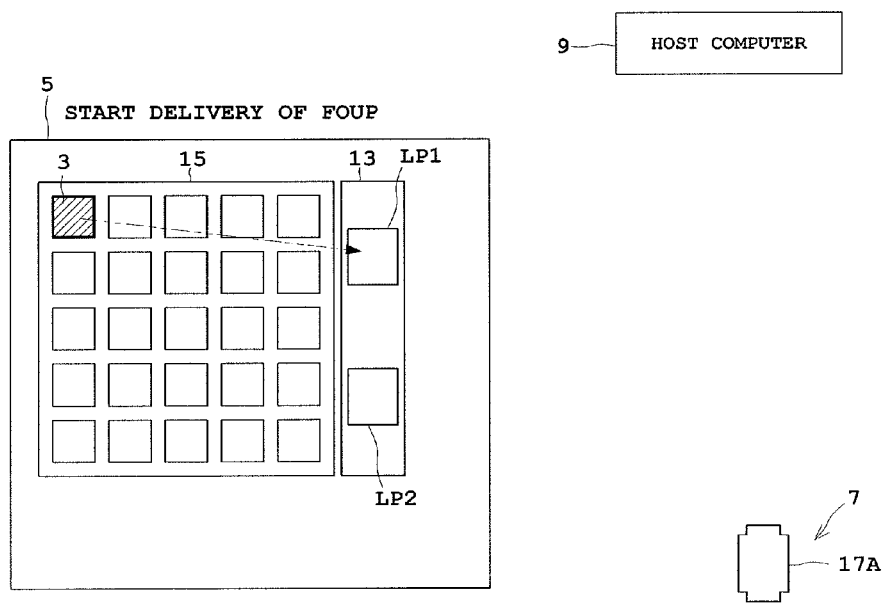
FIG. 14 is a schematic view showing the unloading process and a delivery start.
Figure 15:
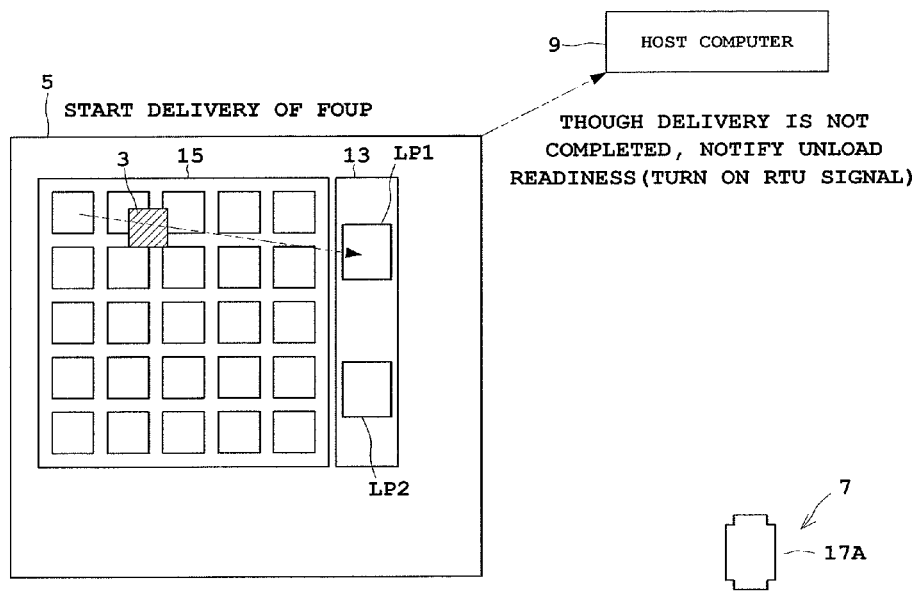
FIG. 15 is a schematic view showing the unloading process and an unload ready notice to a host computer.
Figure 16:
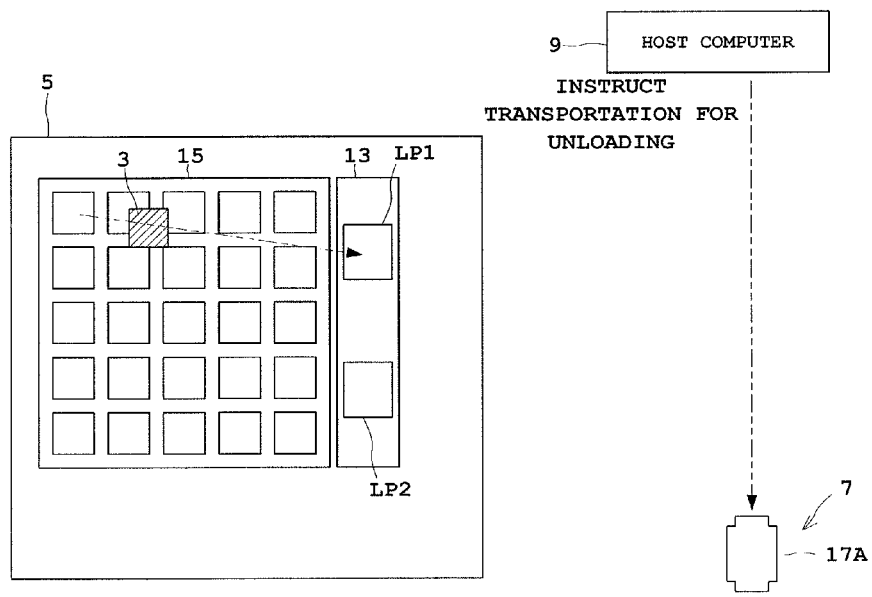
FIG. 16 is a schematic view showing the unloading process and unload instructions to the carrier transport system.
Figure 17:
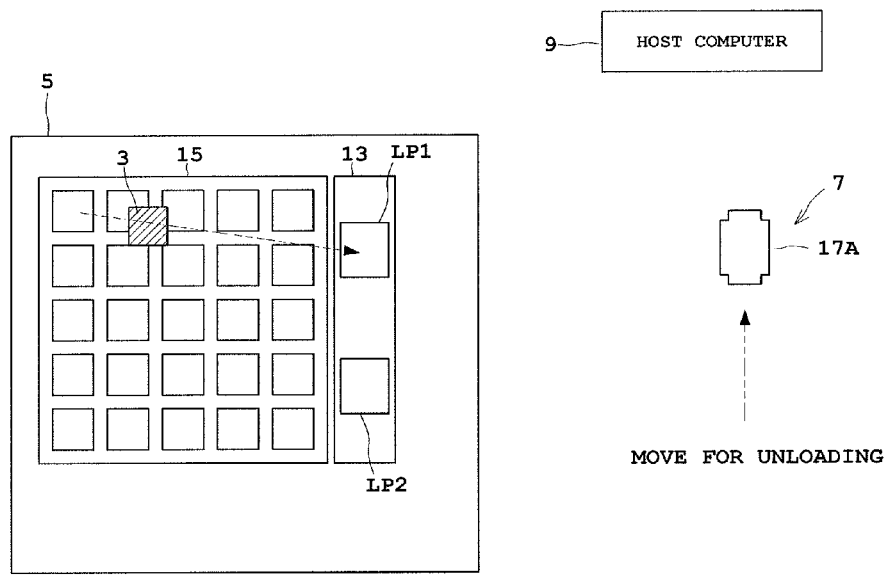
FIG. 17 is a schematic view showing the unloading process and a movement of the carrier transport system.
Figure 18:
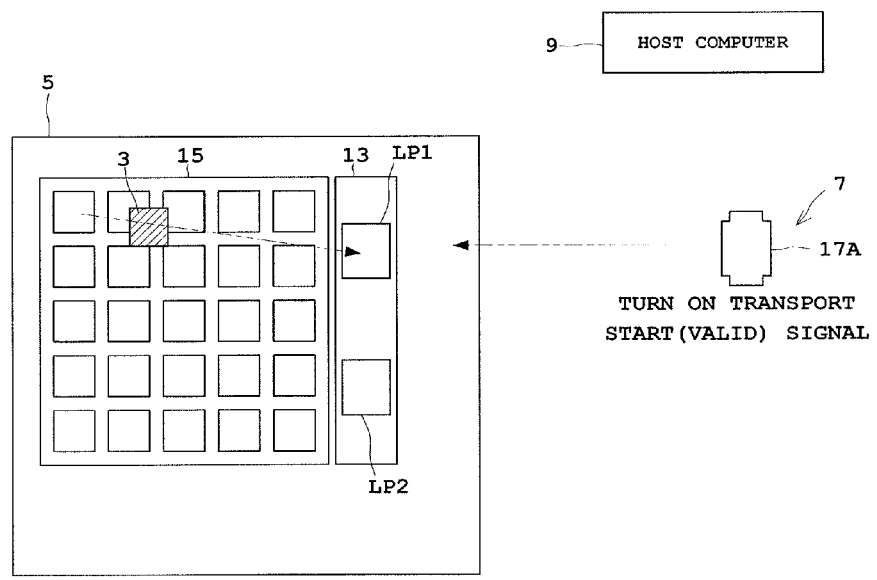
FIG. 18 is a schematic view showing the unloading process and a transport start notice.
Figure 19:
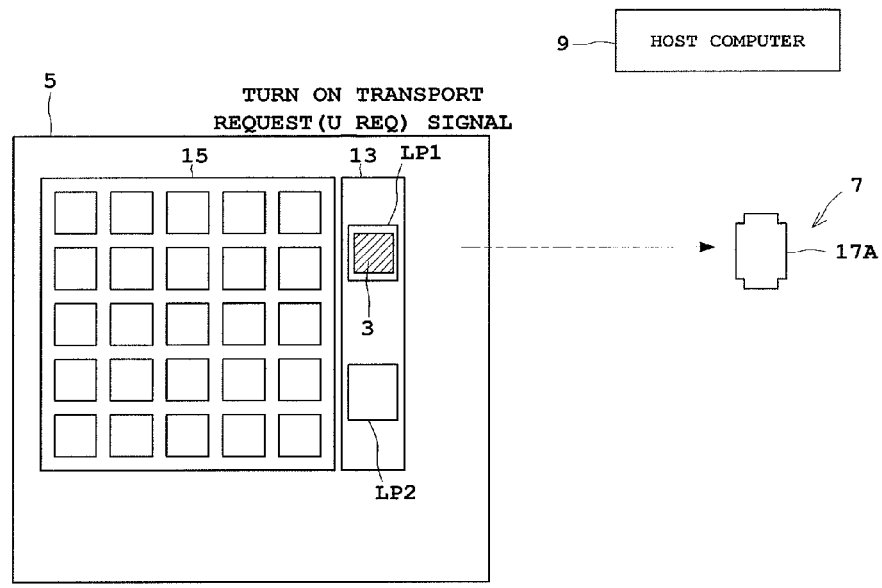
FIG. 19 is a schematic view showing the unloading process and a notice of unload request.
Figure 20:
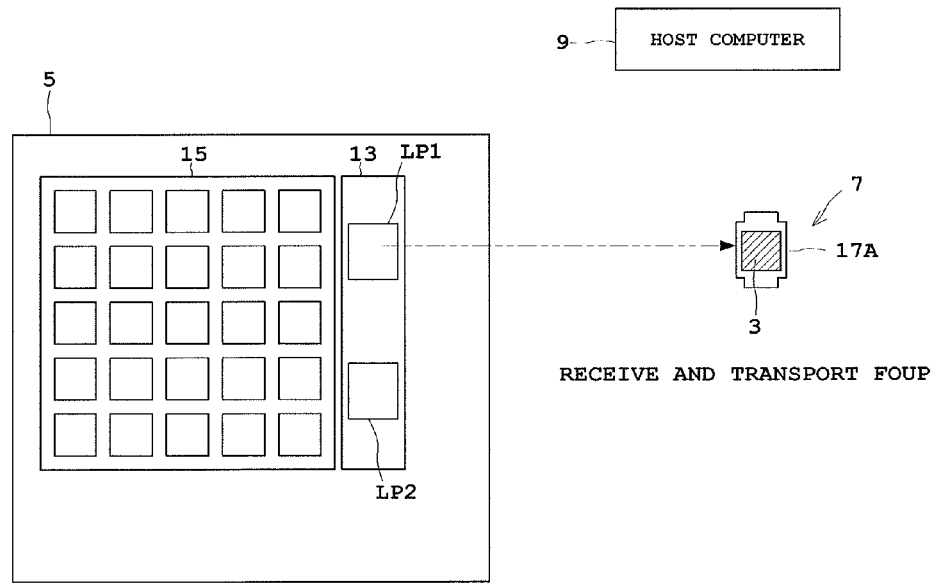
FIG. 20 is a schematic view showing the unloading process and an unloading from the load port.

FIG. 12 is a time chart and flow chart showing a sequence of an unloading process. FIGS. 13-20 are schematic views showing the unloading process. FIG. 13 shows delivery instructions to the substrate treating apparatus. FIG. 14 shows a delivery start. FIG. 15 shows an unload ready notice to the host computer. FIG. 16 shows unload instructions to the carrier transport system. FIG. 17 shows a movement of the carrier transport system. FIG. 18 shows a transport start notice. FIG. 19 shows a notice of unload request. FIG. 20 shows an unloading from the load port.

In the following description, the OHT 17A of the carrier transport system 7 unloads a FOUP 3 from the substrate treating apparatus 5. It is assumed that the OHT 17A is moving along the circulating track.

The host computer 9 instructs the substrate treating apparatus 5 to unload the FOUP 3 (FIG. 13). In response to this, the substrate treating apparatus 5 takes a situation of the internal buffer management unit 23 into consideration, and starts a process of unloading the designated FOUP 3 from a rack of the internal buffer 15 (FIG. 14, step S11).

The substrate treating apparatus 5 has just begun to move the FOUP 3 to the load port 13, and although the movement to the load port 13 is not completed, notifies unload permission (turns on a RTU (Ready To Unload) signal) to the host computer 9 (FIG. 15, step S12). In response to this, the host computer 9 gives an unloading instruction to the OHT 17A of the carrier transport system 7 (FIG. 16). The OHT 17A moves to the substrate treating apparatus 5 (FIG. 17), and when the movement is completed, turns on an unloading start (VALID) signal (FIG. 18, step S13).

The host-related control unit 21 branches the process according to conditions, taking a situation by the load port management unit 19 into consideration. "Condition 1" is that the FOUP 3 is placed on the load port 13, and the FOUP 3 can be unloaded therefrom. "Condition 2" is a case where the FOUP 3 is being transported from the internal buffer 15, and its delivery to the load port 13 is not completed. "Condition 3" corresponds to a case other than conditions 1 and 2. This includes a case where, for example, the internal buffer 15 or the load port 13 is out of order and unusable.

When condition 1 is met, a transport request is made (U_REQ (Unload REQuest) signal is turned on) to the carrier transport system 7 (FIG. 19, step S15). The carrier transport system 7 instructs the OHT 17A to unload the FOUP 3 from the load port 13. The OHT 17A receives the FOUP 3 from the load port 13 and starts the transportation (FIG. 20).

When condition 2 is met, a time adjustment is carried out (step S16), and a transport request is suspended in the meantime. Subsequently, the transport request is made (step S15). When condition 3 is met, the HO_AVBLE signal is turned off (step S16) to stop the unloading process.

Thus, when the substrate treating apparatus 5 begins to deliver the FOUP 3 to the load port 13, the host-related control unit 21 reports to the host computer 9 that the FOUP 3 is ready to be unloaded. Therefore, compared with the case of giving an unload ready report after the FOUP 3 is actually placed on the load port 13, the time can be advanced for the host computer 9 to start moving the carrier transport system 7. As a result, the carrier transport system 7 can be used effectively in unloading the FOUPs 3.

Generally, when the carrier transport system 7 moved onward to unload a FOUP 3 but found the load port 13 having no FOUP 3 placed thereon, the carrier transport system 7 would return the OHT 17 to the circulating track. However, in this embodiment, notices of transfer propriety such as the transport request, transport disapproval, and so on are suspended until completion of transfer between the load port 13 and the internal buffer 15, and the OHT 17 stands by until the FOUP 3 is placed on the load port 13, thereby eliminating wasteful circulating movement.

This invention is effective where, in loading the FOUPs 3 into the substrate treating apparatus 5, a plurality of vehicles, i.e. OHTs 17, transport the FOUPs 3 to the substrate treating apparatus 5 consecutively at no long interval of time. In controlling this type of substrate treating apparatus and carrier transport system, it is common practice to cause one OHT to carry out a loading operation for one load port used for loading. With such control, it is rare that a plurality of OHTs 17 transport the FOUPs 3 to the substrate treating apparatus 5 consecutively at no long interval of time, as noted above. Therefore, this invention demonstrates a greater effect when control is performed to cause a plurality of OHTs to carry out loading at the same time to one load port used for loading. A further embodiment relating to such control will be described hereinafter. Like reference signs will be affixed to like or corresponding parts in the foregoing embodiment.

Figure 21:
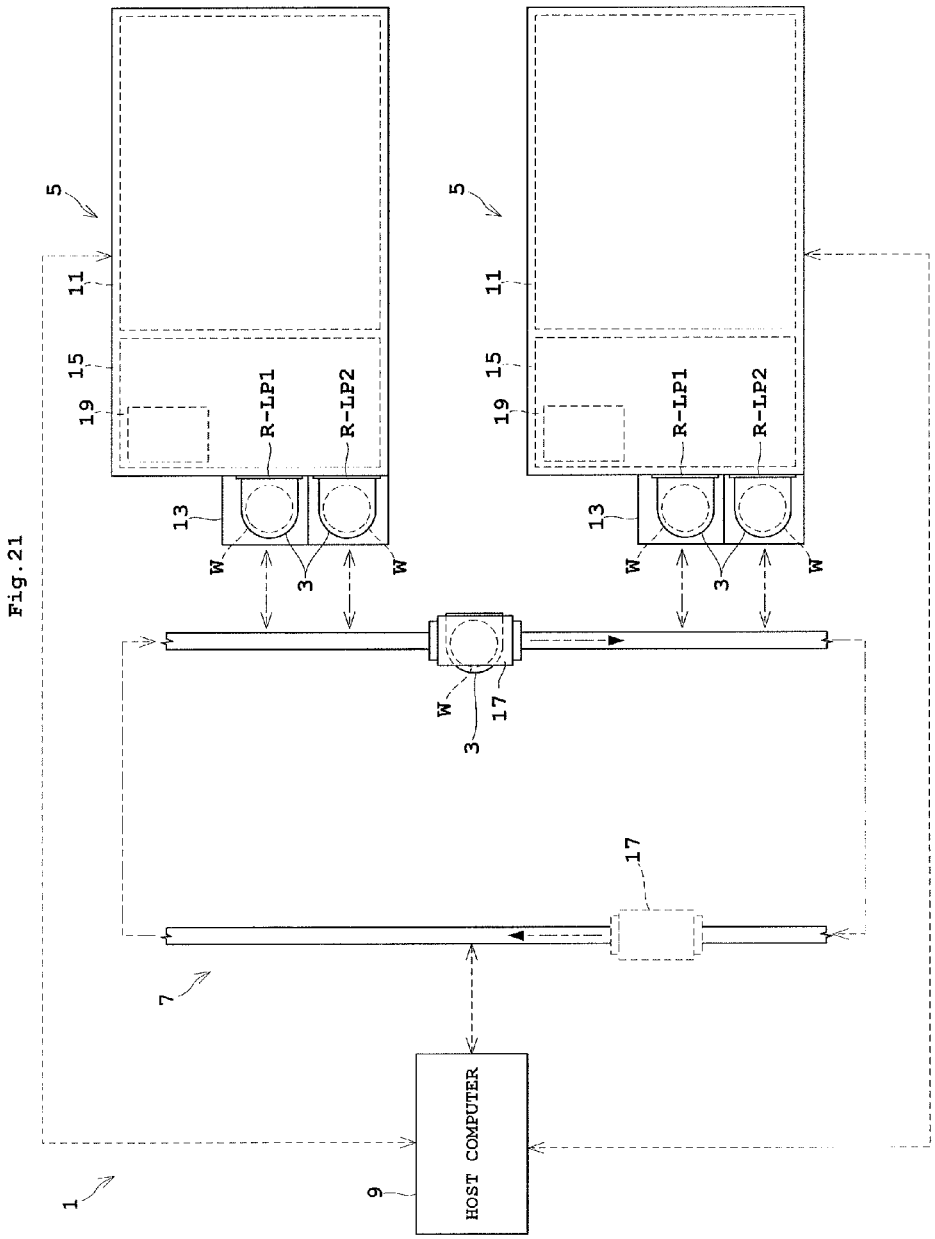
FIG. 21 is a plan view showing an outline of a substrate treating system in a further embodiment of this invention.
Figure 22:
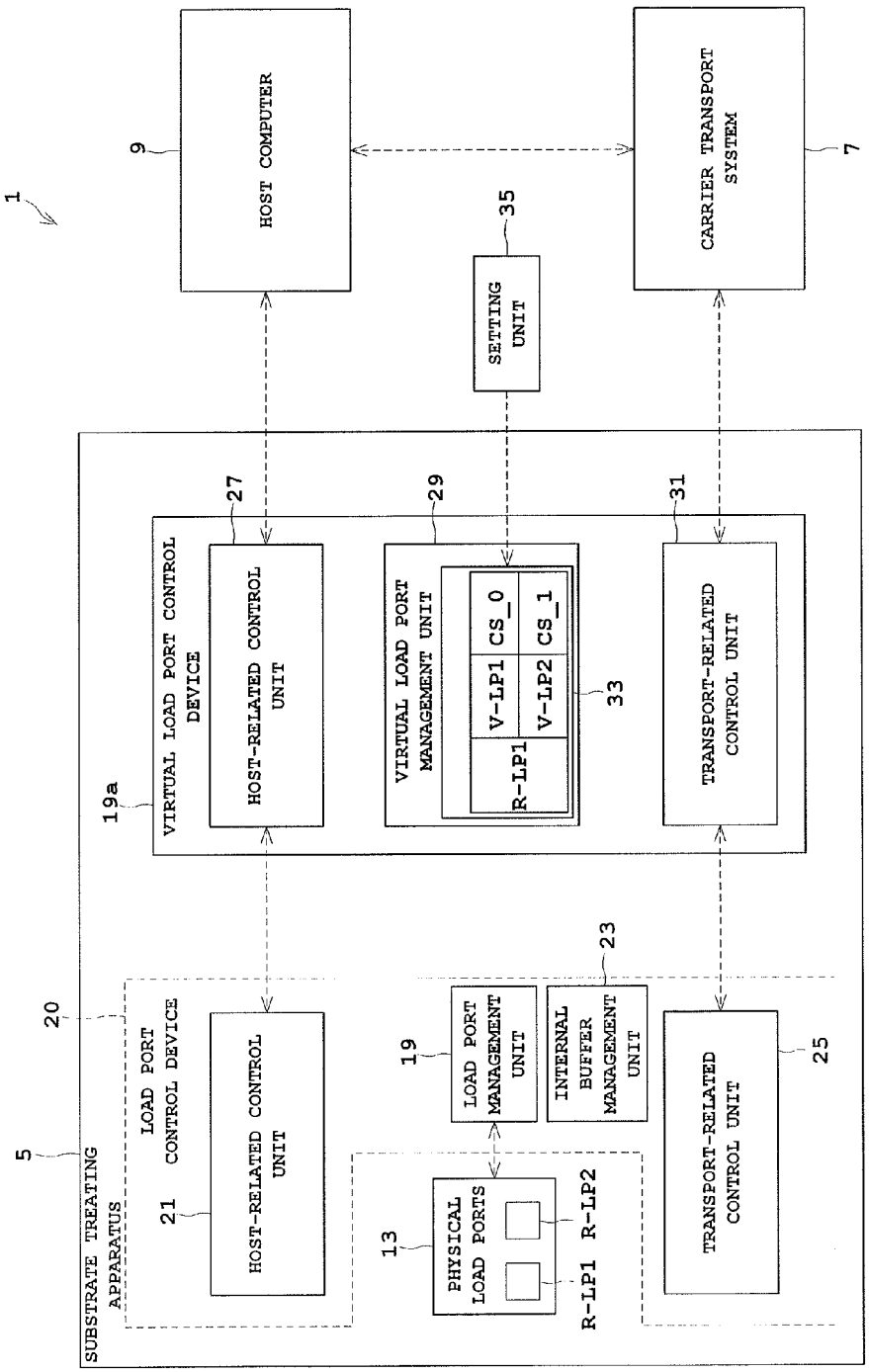
FIG. 22 is a block diagram showing an outline construction of the substrate treating system in the further embodiment.

FIG. 21 is a plan view showing an outline of a substrate treating system in a further embodiment of this invention. FIG. 22 is a block diagram showing an outline construction of the substrate treating system in the further embodiment.

The substrate treating system 1 in this embodiment has functions to receive wafers W along with FOUPs 3, treat the wafers W and deliver the treated wafers W along with the FOUPs 3. FOUP is an abbreviation of Front Opening Unified Pod, and the FOUPs 3 store wafers W in a sealed condition to secure clean environment.

This substrate treating system 1 includes substrate treating apparatus 5, a carrier transport system 7, and a host computer 9. It is general practice to provide a plurality of substrate treating apparatus 5, and FIG. 21 shows two substrate treating apparatus 5 by way of example.

Each substrate treating apparatus 5 has a substrate treating unit 11, a load port 13, and an internal buffer 15. The substrate treating unit 11 carries out predetermined treatments of the wafers W taken out of the FOUPs 3. The predetermined treatments include cleaning treatment, etching treatment, and photoresist removing treatment, for example. The load port 13 serves for transferring the FOUPs 3 between the substrate treating apparatus 5 and the carrier transport system 7. In this example, the load port 13 includes two physical load ports R-LP1 and R-LP2. The internal buffer 15 is disposed between the substrate treating unit 11 and the load port 13 for transferring FOUPs 3 to and from the load port 13, and transferring the wafers W taken out of the FOUPs 3 to and from the substrate treating unit 11. The internal buffer 15 has a buffering function to store temporarily the FOUPs 3 loaded from the load port 13 when the substrate treating unit 11 is in a state not capable of accepting the wafers W, and store temporarily the FOUPs 3 when the load port 13 is in a state not capable of accepting delivery of the FOUPs 3.

The above FOUPs 3 correspond to the "pods" in this invention.

The carrier transport system 7 transports FOUPs 3 between the substrate treating apparatus 5 and a depository (not shown) which stores a plurality of FOUPs 3, or to and from other substrate treating apparatus. The carrier transport system 7 may be AMHS (Automated Material Handling Systems) such as AGVs (Automatic Guided Vehicles) or OHT (Overhead Hoist Transport), for example. This embodiment employs a construction, as an example, in which a plurality of OHTs 17 circulate in an area adjacent the two substrate treating apparatus 5.

The host computer 9 communicates with the substrate treating apparatus 5 and carrier transport system 7 described above. The host computer 9 instructs for transportation of the FOUPs 3 by the carrier transport system 7 according to situations of the substrate treating apparatus 5. The "transportation" here refers to "loading" which is transportation for carrying the FOUPs 3 into the substrate treating apparatus 5, and "unloading" which is transportation for carrying the FOUPs 3 out of the substrate treating apparatus 5.

As shown in FIG. 22, each substrate treating apparatus 5 includes a load port control device 20 formed of a host-related control unit 21, a load port management unit 19, an internal buffer management unit 23, and a transport-related control unit 25. These host-related control unit 21, load port management unit 19, internal buffer management unit 23, and transport-related control unit 25 constituting the load port control device 20 have the same functions as included in a common substrate treating apparatus. That is, in a common substrate treating system, the load port management unit 19 is connected to the physical load ports R-LP1 and R-LP2 of the load port 13 and the internal buffer 15 provided for each substrate treating apparatus 5, to recognize states of these components through communication therewith and manage them such as by controlling operations thereof. In the common substrate treating system, the host-related control unit 21 is connected to the host computer 9 to communicate a request for loading FOUPs 3 to the host computer 9, for example, by referring to the states of the physical load ports R-LP1 and R-LP2 recognized by the load port management unit 19. In the common substrate treating system, the transport-related control unit 25 is connected to the carrier transport system 7 to perform communications relating to control of loading of the FOUPs 3 (such as CS signals to be described hereinafter) with the carrier transport system 7 by referring to the states of the physical load ports R-LP1 and R-LP2 recognized by the load port management unit 19, for example. The internal buffer management unit 23 determines use states and the like of the internal buffer 15, and determines which racks FOUPs 3 should be stored on and which racks FOUPs 3 should be unloaded from.

In this embodiment, as distinct from the common substrate treating system noted above, a virtual load port control device 19a is interposed and connected between the host-related control unit 21 and the host computer 9, and between the transport-related control unit 25 and the carrier transport system 7. That is, the substrate treating system 1 in this embodiment is constructed by post-installing the virtual load port control device 19a between the common substrate treating apparatus and the host computer 9 and carrier transport system 7. Here, the virtual load port control device 19a connected in post-installation is considered also to be included in the substrate treating apparatus 5.

The virtual load port control device 19a allots a plurality of virtual load ports to each of the two physical load ports R-LP1 and R-LP2. The virtual load port control device 19a causes the carrier transport system 7 and host computer 9 to treat the plurality of virtual load ports as a plurality of physical load ports. In other words, the virtual load port control device 19a carries out signal processing and communication in a way to indicate to the carrier transport system 7 and host computer 9 as if there were more physical load ports than the two real physical load ports R-LP1 and R-LP2.

Regarding operations of the host computer 5 and carrier transport system 7 which behave as if there were more physical load ports than there actually are, the host-related control unit 21 and transport-related control unit 25 allot the required responses to the two real physical load ports R-LP1 and R-LP2. Specifically, the virtual load port control device 19a includes a host-related control unit 27, a virtual load port management unit 29, and a transport-related control unit 31. The virtual load port management unit 29 has a conversion table storage unit 33. The conversion table storage unit 33 stores, inputted thereto beforehand, a "conversion table" which specifies a correspondence relationship between physical load ports and virtual load ports. This conversion table is set as appropriate by the operator through a setting unit 35.

The host-related control unit 27 receives a notice concerning the physical load ports R-LP1 and R-LP2 from the load port management unit 19, refers to the information in the virtual load port management unit 29, converts the notice into a notice concerning the virtual load ports allotted to such physical load ports, and transmits the converted notice to the host computer 9.

The transport-related control unit 31 receives a notice concerning virtual load ports V-LP1-V-LP4 from the carrier transport system 7, refers to the information in the virtual load port management unit 29, converts the notice into a notice concerning the physical load ports allotted to such virtual load ports, and transmits the converted notice to the transport-related control unit 25. Conversely, the transport-related control unit 31 receives a notice concerning the physical load ports R-LP1 and R-LP2 from the transport-related control unit 25, refers to the information in the virtual load port management unit 29, converts the notice into a notice concerning the virtual load ports allotted to such physical load ports, and transmits the converted notice to the carrier transport system 7.

Next, a flow of "loading" of the FOUPs 3 by the above substrate treating system 1 will be described with reference to FIGS. 23-34.

Figure 23:
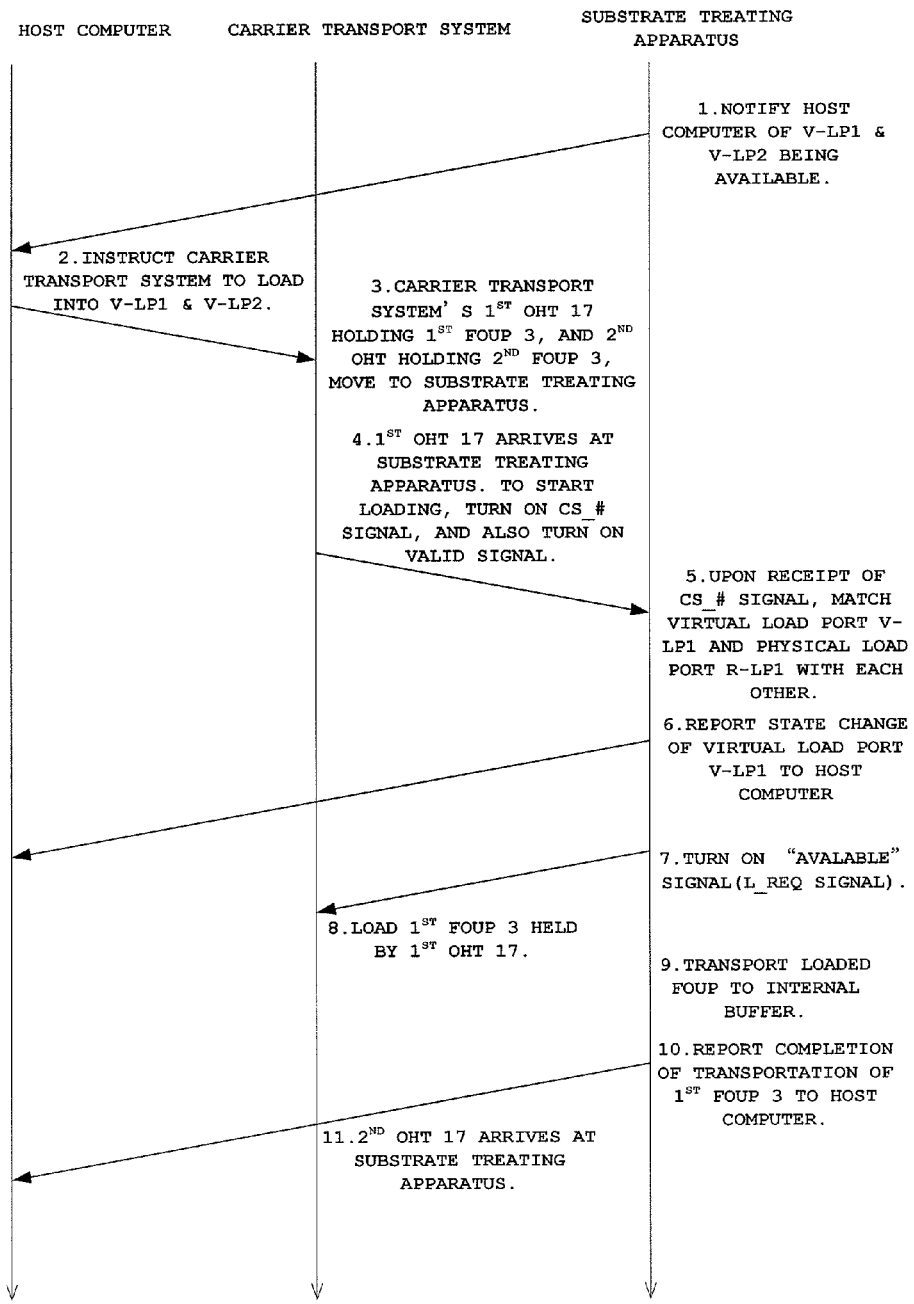
FIG. 23 is a time chart showing a sequence of a loading process.
Figure 24:
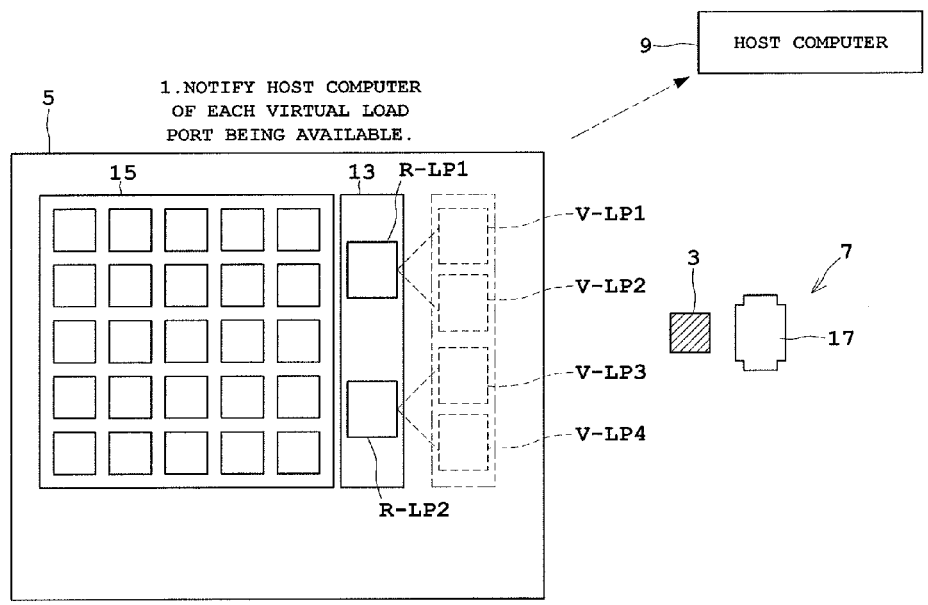
FIG. 24 is a schematic view showing the loading process and a notice to the host computer.
Figure 25:
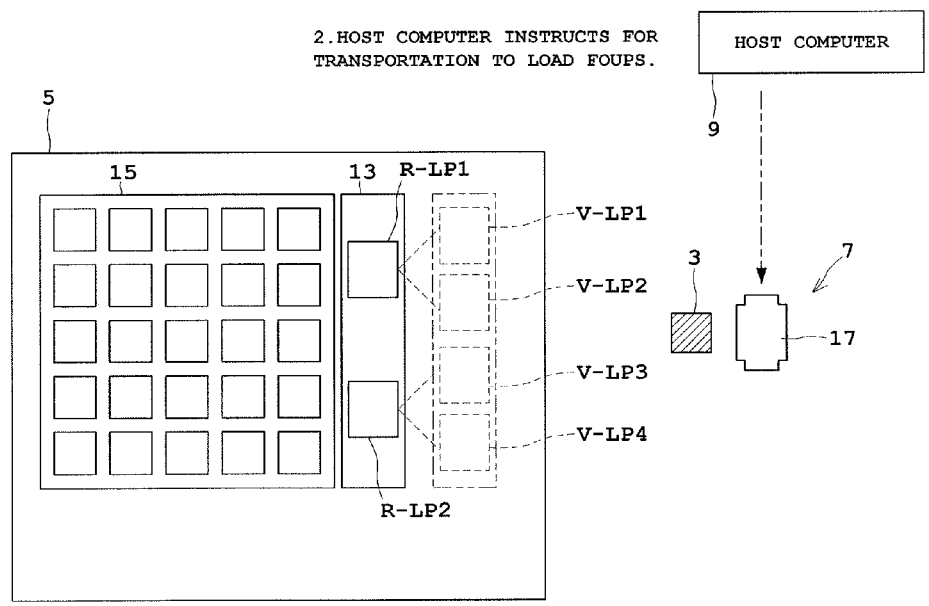
FIG. 25 is a schematic view showing the loading process and transport instructions from the host computer.
Figure 26:
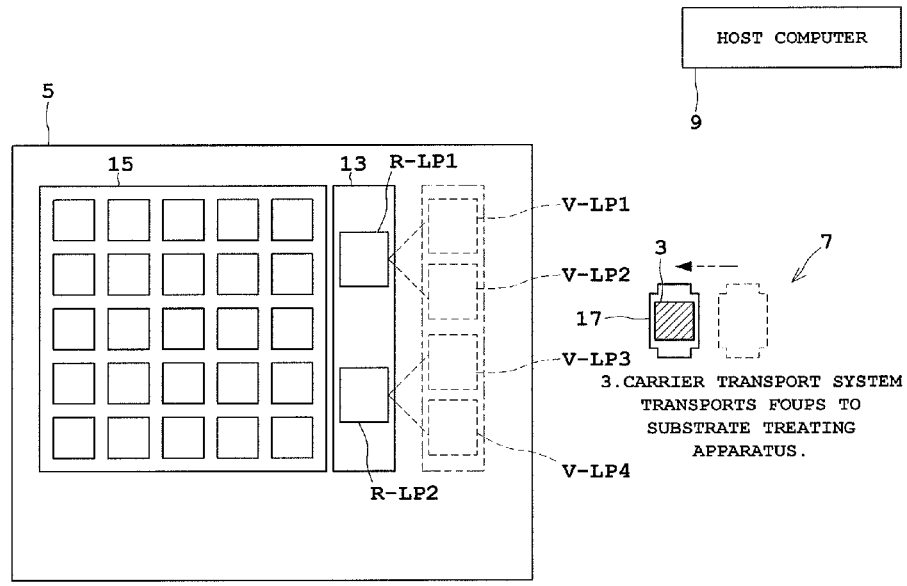
FIG. 26 is a schematic view showing the loading process and a movement of the carrier transport system.
Figure 27:
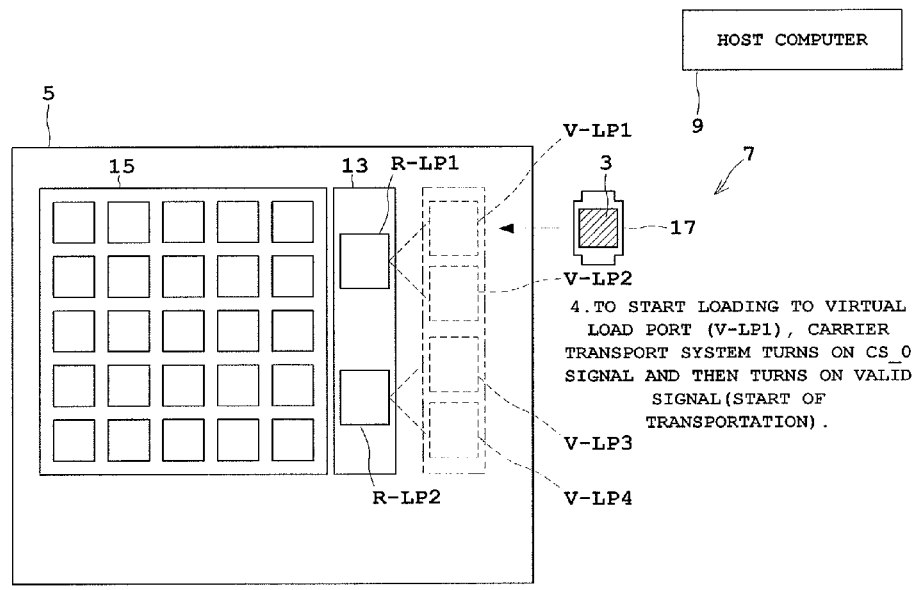
FIG. 27 is a schematic view showing the loading process and a start of loading by the carrier transport system.
Figure 28:
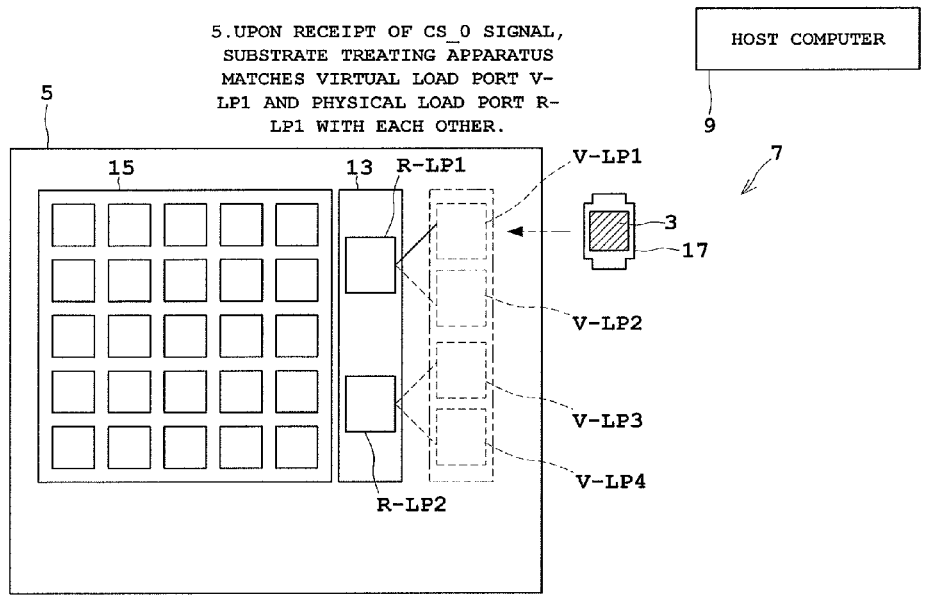
FIG. 28 is a schematic view showing the loading process and matching of load ports.
Figure 29:
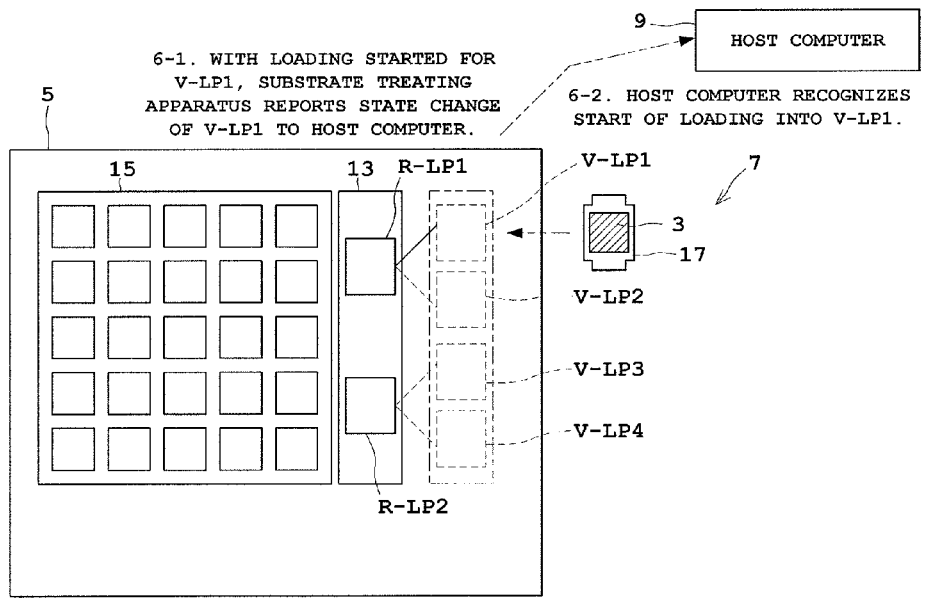
FIG. 29 is a schematic view showing the loading process and a report on a state change of a virtual load port.
Figure 30:
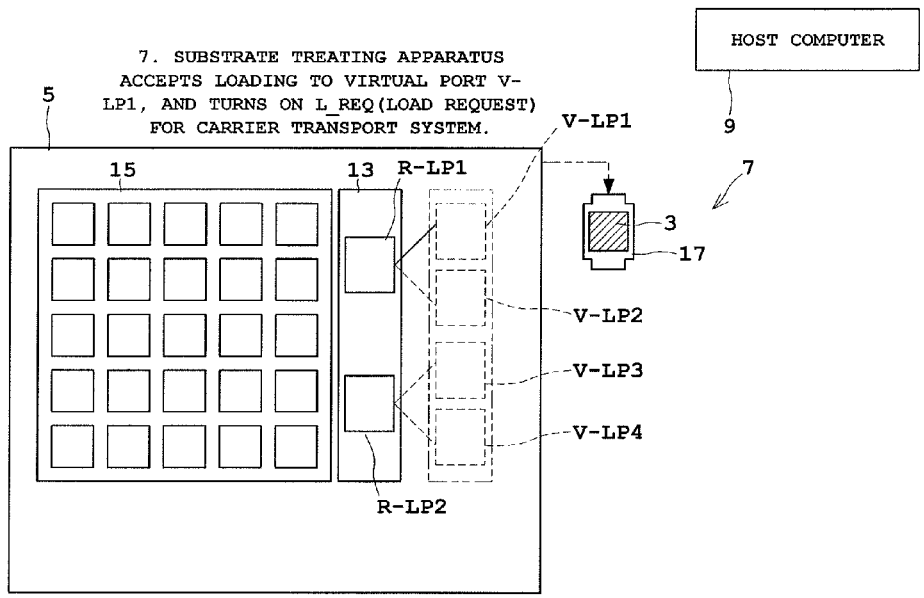
FIG. 30 is a schematic view showing the loading process and a load reception.
Figure 31:
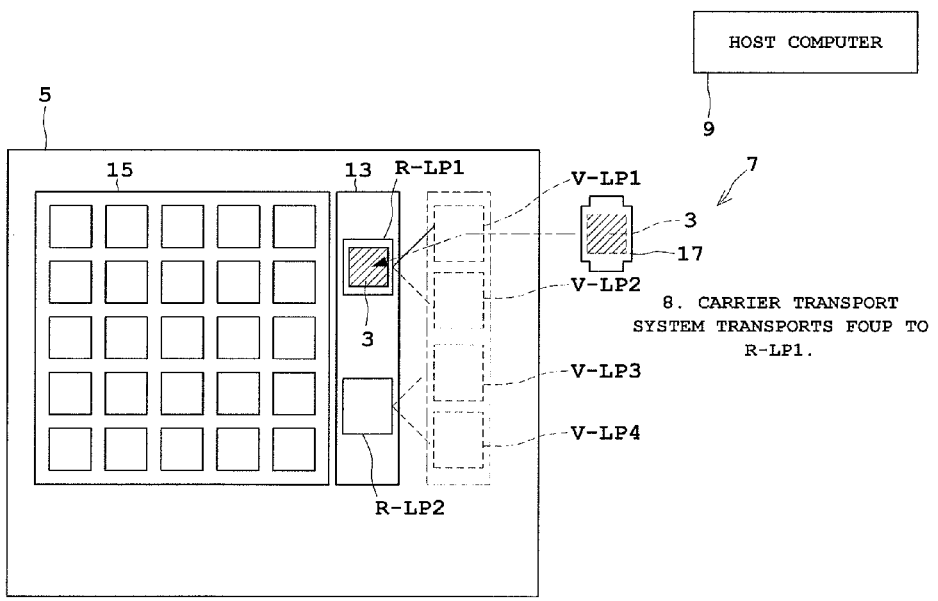
FIG. 31 is a schematic view showing the loading process and a movement of the carrier transport system.
Figure 32:
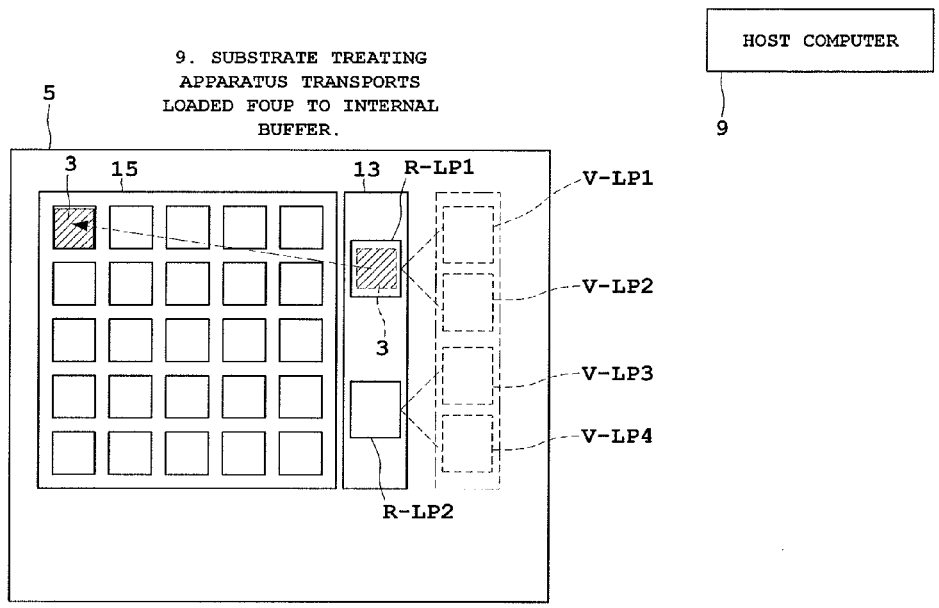
FIG. 32 is a schematic view showing the loading process and movement of a FOUP to an internal buffer.
Figure 33:
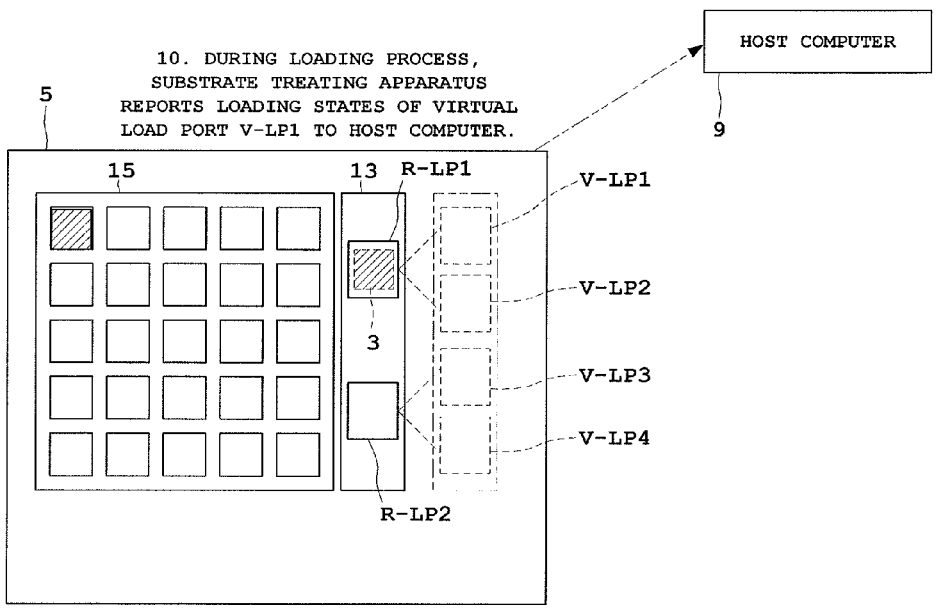
FIG. 33 is a schematic view showing the loading process and a report on a loading situation.
Figure 34:
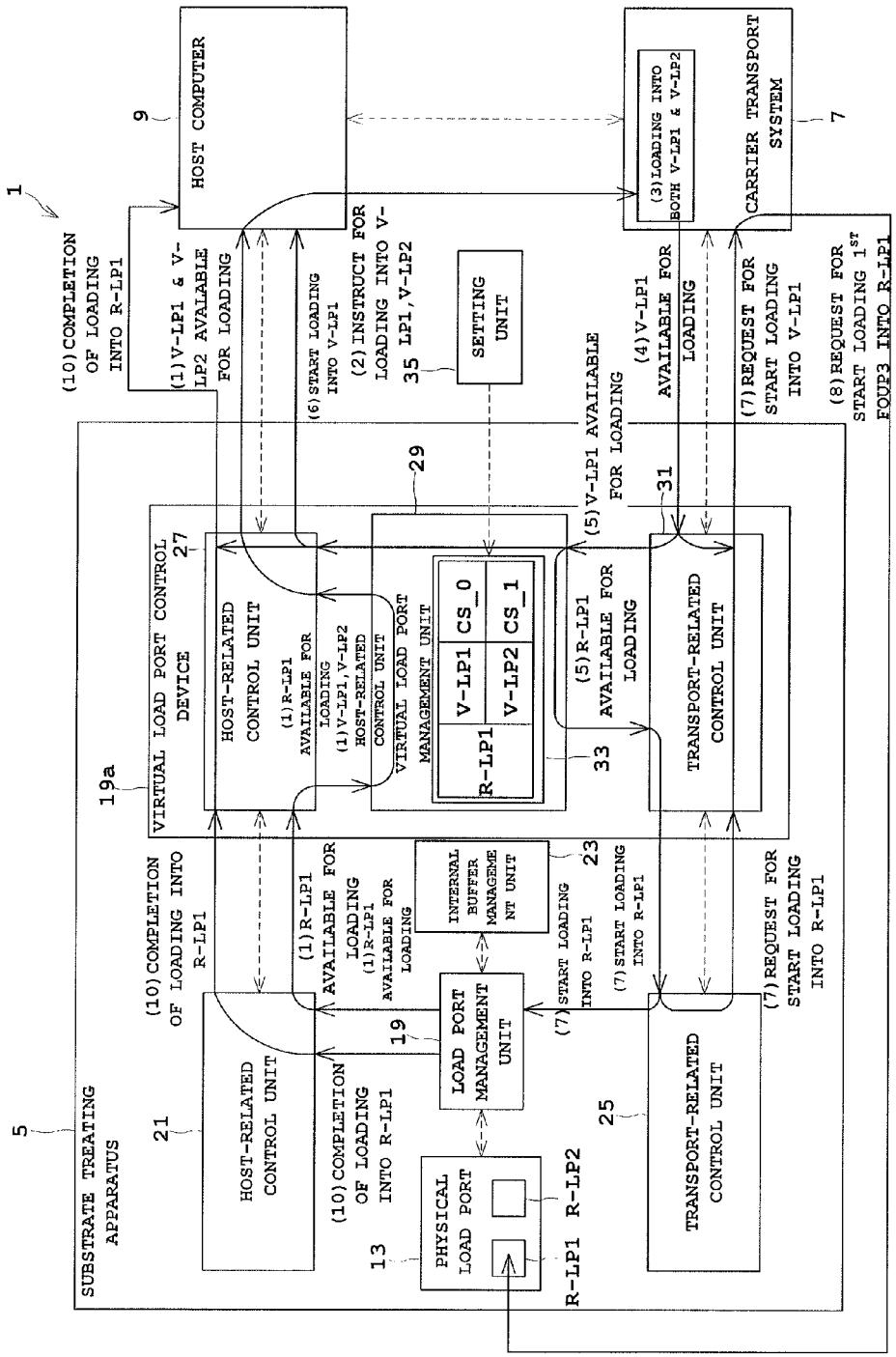
FIG. 34 is a schematic view showing an exchange of signals among the components during the loading process.

FIG. 23 is a time chart showing a sequence of a loading process. FIGS. 24-33 are schematic views showing the loading process. FIG. 24 shows a notice to the host computer. FIG. 25 shows transport instructions from the host computer. FIG. 26 shows a movement of the carrier transport system. FIG. 27 shows a start of loading by the carrier transport system. FIG. 28 shows matching of the load ports. FIG. 29 shows a report on a state change of a virtual load port. FIG. 30 shows a load reception. FIG. 31 shows a movement of the carrier transport system. FIG. 32 shows movement of a FOUP to the internal buffer. FIG. 33 shows a report on a loading situation. FIG. 34 is a schematic view showing an exchange of signals among the components during the loading process.

In the following description, it is assumed that, as shown in FIG. 24, the physical load port R-LP1 is matched with two virtual load ports V-LP1 and V-LP2, and the physical load port R-LP2 with two virtual load ports V-LP3 and V-LP4. This correspondence relationship is specified on the conversion table in the conversion table storage unit 33 noted hereinbefore. It is also assumed here that the two virtual load ports V-LP1 and V-LP2 are set for loading purposes. To facilitate understanding, description will be made hereinafter only of the virtual load ports V-LP1 and V-LP2.

1. The substrate treating apparatus 5 notifies the host computer 9 as to whether the two virtual load ports V-LP1 and V-LP2 are available for loading (FIG. 24). Specifically, the host-related control unit 27 of the virtual load port control device 19a refers to the virtual load port management unit 29, and notifies the host computer 9 that the load ports named virtual load ports V-LP1 and V-LP2 are available for loading.

To describe this in greater detail, the load port management unit 19 which manages the physical load port R-LP1 first recognizes the state of the physical load port R-LP1 as "available for loading". In response to this, the host-related control unit 21 refers to the recognition by the load port management unit 19 and outputs an "available" notice. With the conventional common construction, this output would be transmitted directly to the host computer 9. However, in this invention, the "available" notice outputted from the host-related control unit 21 is transmitted to the host-related control unit 27 of the virtual load port control unit 19a. Upon receipt of this notice, the virtual load port management unit 29 refers to the conversion table stored in the internal conversion table storage unit 33, and recognizes that the physical load port R-LP1 notified as "available" is matched with the virtual load ports V-LP1 and V-LP2. Then, the virtual load port management unit 29 notifies the host-related control unit 27 that, instead of the physical load port R-LP1 notified as "available", both virtual load ports V-LP1 and V-LP2 are to be treated as "available". Based on such notice, the host-related control unit 27 notifies the host computer 9 that both virtual load ports V-LP1 and V-LP2 are "available".

2. Having received the above notice, the host computer 9 instructs the carrier transport system 7 to load two FOUPs 3 to be processed by the substrate treating apparatus 5, into both virtual load ports V-LP1 and V-LP2, respectively (FIG. 25).

3. The carrier transport system 7 fetches a first and a second FOUPs 3 from a substrate treating apparatus at an upstream stage or from the depository. With a first OHT 17 holding the first FOUP 3 and a second OHT 17 holding the second FOUP 3, each starts moving toward the substrate treating apparatus 5 from which the loading instructions have originated. It is assumed here that both the first OHT 17 and second OHT 17 carry out the loading into the same substrate treating apparatus 5, and that the first OHT 17 is in a position to reach the substrate treating apparatus 5 earlier, with the second OHT 17 in a position to reach the substrate treating apparatus 5 thereafter.

4. When the first OHT 17 arrives at the substrate treating apparatus 5, the carrier transport system 7 notifies the substrate treating apparatus 5 that the first FOUP 3 will be loaded into the virtual load port V-LP1 (FIG. 27). Specifically, the carrier transport system 7 turns on CS_0 signal, further turns on a VALID signal indicating a transport start, and transmits the signals to the transport-related control unit 31. The CS signal is a carrier stage signal used for designation of the load ports, and is prescribed by SEMI standard E84.

5. The substrate treating apparatus 5 refers to the CS_0 signal (indicating the virtual load port V-LP1) received from the carrier transport system 7 and the conversion table, and matches the virtual load port V-LP1 with one corresponding physical load port R-LP1 (FIG. 28). Specifically, based on the signal received by the transport-related control unit 31, the virtual load port management unit 29 performs the matching.

6-1. The substrate treating apparatus 5 reports to the host computer 9 the start of loading into the virtual load port V-LP1 as a change of state (FIG. 29). Specifically, the virtual load port management unit 29 reports it to the host computer 9 through the host-related control unit 27.

6-2. The host computer 9 having received the report recognizes that loading has started at the virtual load port V-LP1 (FIG. 29).

7. In order to accept in the physical load port R-LP1 the first FOUP 3 transported by the carrier transport system 7 toward the virtual load port V-LP1, the substrate treating apparatus 5 instructs the physical load port R-LP1 to accept the first FOUP 3, and requests the carrier transport system 7 to carry out a loading operation (FIG. 30). Specifically, the virtual load port management unit 29 communicates instructions to the transport-related control unit 25 through the transport-related control unit 31 for loading into the physical load port R-LP1. Upon receipt of this communication, the transport-related control unit 25 instructs the load port management unit 19 to carry out an operation for loading into the physical load port R-LP1, and requests the transport-related control unit 31 to make a "loading start" for the physical load port R-LP1. Such a request signal would be transmitted to the carrier transport system 7 if this were a conventional substrate treating system. In this invention, this request signal is transmitted to the transport-related control unit 31 of the virtual load port control device 19a.

The transport-related control unit 31 can recognize that the "loading start" request signal from the transport-related control unit 25 is a response to the notice of loading of the first FOUP 3 into the virtual load port V-LP1 received from the carrier transport system 7 in step 4 above. Based on such recognition, the transport-related control unit 31 transmits such "loading start" request signal to the carrier transport system 7 as "loading start" request relating to the virtual load port V-LP1. As such request signal, the transport-related control unit 31 turns on L_REQ signal for the carrier transport system 7. L_REQ stands for load request.

8. In response to the "loading start" request from the transport-related control unit 31, the carrier transport system carries out an operation for transporting the first FOUP 3 held by the first OHT 17 toward the virtual load port V-LP1. The carrier transport system 7 has an actual position of the physical load port R-LP1 set thereto as position information on the virtual load port V-LP1 which is the destination of the transportation at this time. Thus, the transportation to the virtual load port V-LP1 by the carrier transport system 7 will be performed in reality as transportation to the physical load port R-LP1 (FIG. 31).

9. The substrate treating apparatus 5 transports the first FOUP 3 loaded into the physical load port R-LP1 to an appropriate position in the internal buffer 15 (FIG. 32).

10. In the above loading process, the substrate treating apparatus 5 reports to the host computer 9 completion of the loading of the first FOUP 3 into the physical load port R-LP1 as completion of the loading into the virtual load port V-LP1 (FIG. 33). Specifically, the load port management unit 19 recognizes the situation of the physical load port R-LP1, and reports it to the host computer 9 through the host-related control unit 21 and host-related control unit 27.

At this time, the host-related control unit 21 transmits to the host-related control unit 27 the "loading completion" report on the physical load port R-LP1 received from the load port management unit 23. The host-related control unit 27 can recognize that the "loading completion" report from the host-related control unit 21 is a response to the notice of the start of loading the first FOUP 3 into the virtual load port V-LP1, which notice has been received from the virtual load port management unit 29 in step 6 above. Based on such recognition, the host-related control unit 27 transmits the "loading completion" report to the host computer 9 as a "loading completion" report on the virtual load port V-LP1.

When, in step 9 above, the first FOUP 3 loaded into the physical load port R-LP1 has been transported to the internal buffer 15, the physical load port R-LP1 becomes capable of accepting a FOUP 3 again. Thus, as in step 1 above, the load port management unit 19 recognizes the state of the physical load port R-LP1 as "available". Consequently, the host-related control unit 21 refers to the recognition by the load port management unit 19, and transmits an "available" notice to the host-related control unit 27 of the virtual load port control device 19a. In response thereto, the host-related control unit 27 recognizes that the virtual load port V-LP1 has become "available", as in the case of the above "loading completion" report, and notifies this to the host computer 9. Such "available" notice will be made immediately or with a slight delay after the above "loading completion" report, depending on the timing of transportation of the FOUP 3 to the internal buffer 15. In the described case, the "available" state of the virtual load port V-LP2 has already been reported in step 1 above, and accordingly, the second OHT 17 has already started transporting the second FOUP 3. Here, therefore, no new notice is made with regard to the virtual load port V-LP2.

11. When the second OHT 17 arrives at the substrate treating apparatus 5 slightly later than the first OHT 17, the carrier transport system 7, as in step 4 above, notifies the substrate treating apparatus 5 that the second FOUP 3 will be loaded into the virtual load port V-LP2. Specifically, the carrier transport system 7 turns on CS_1 (indicating the virtual load port V-LP2), further turns on the VALID signal indicating a transport start, and transmits the signals to the transport-related control unit 31. Subsequently, as described hereinbefore, a loading into the physical load port R-LP1 is carried out as loading into the virtual load port V-LP2.

When there is only one FOUP 3, i.e. the first FOUP 3, to be treated by the substrate treating apparatus 5 at the time of step 2 above, the host computer 9 instructs for transportation to the virtual load port V-LP1, but does not instruct for transportation to the virtual load port V-LP2 immediately. The host computer 9 will wait until a second FOUP 3 to be treated becomes ready.

According to this embodiment, two virtual load ports V-LP1 and V-LP2 are allotted to one physical load port V-LP1, with both of the virtual load ports V-LP1 and V-LP2 being "available", two OHTs 17 can be moved at the same time to transport FOUPs 3 to the respective load ports V-LP1 and V-LP2. Compared with the case of only one OHT 17 engaging in the transporting operation for one physical load port R-LP1, this embodiment can increase the number of FOUPs 3 transportable per unit time. In other words, the time taken for transporting each FOUP 3 can be shortened.

As seen also from FIG. 34, the virtual load port control device 19a handles only signals relating to the physical load port R-LP1 in the communication with the host-related control unit 21 and transport-related control unit 25 which are inherent in the substrate treating apparatus 5, and handles only signals relating to the virtual load ports V-LP1 and V-LP2 in the communication with the host computer 9 and carrier transport system 7. That is, the virtual load port control device 19a is interposed between the substrate treating apparatus 5 and the host computer 9/carrier transport system 7 to carry out matching of the physical load port R-LP1 and the virtual load ports V-LP1 and V-LP2, and conversion of the signals. The controls according to this invention can be implemented easily, without changing in any way the constructions of hardware and software of the conventional substrate treating apparatus 5, host computer 9 and carrier transport system 7, and only by interposing the virtual load port control device 19a in between. The construction of the conventional substrate treating system can easily be reinstated only by removing the virtual load port control device 19a.

The virtual load port V-LP2 is another virtual load port matched with the same physical load port R-LP1. In the above loading process, from the point of time when an OHT 17 of the carrier transport system 7 starts moving to the substrate treating apparatus 5 in order to transport one FOUP 3 until the FOUP 3 is actually placed in the physical load port R-LP1 corresponding to one virtual load port V-LP1, the virtual load port control device 19a reports to the host computer 9 that loading can be made into the virtual load port V-LP2 which is the another virtual load port. Further, at the point of time when the FOUP 3 begins to be transported to the internal buffer 15 from the physical load port R-LP1 corresponding to the one virtual load port V-LP1, the virtual load port control device 19 reports to the host computer 9 that loading can be made into the virtual load port V-LP2 which is the another virtual load port different from the virtual load port V-LP1, and is matched with the physical load port R-LP1 corresponding to the virtual load port V-LP1.

Thus, during the above periods, the host computer 9 can instruct the carrier transport system 7 to load a FOUP into the physical load port R-LP1 by turning on the CS_1 signal indicating the virtual load port V-LP2. Therefore, also in the conventionally occupied periods, the host computer 9 can give loading instructions, thereby to realize an efficient loading process.

In the above description, the transportation of the preceding (first) FOUP 3 to the virtual load port V-LP1 is completed, this FOUP 3 is taken into the internal buffer 15, and then the following (second) FOUP 3 is loaded into the virtual load port V-LP2 allotted to the same physical load port R-LP1. Therefore, no problem arises in the loading into the same physical load port R-LP1. If, before completion of the transfer of the preceding (first) FOUP 3 to the internal buffer 15, the following (second) FOUP 3 arrives at the same physical load port R-LP1, this will meet condition 2 in step S1 in FIG. 3 of the first embodiment described hereinbefore. At this time, as in the first embodiment, the transport-related control unit 25 suspends a notice of loading disapproval, instead of sending it to the carrier transport system 7. This suspension continues until completion of the transfer of the preceding (first) FOUP 3 to the internal buffer 15. When the preceding (first) FOUP 3 has been taken into the internal buffer 15 and the internal buffer management unit 23 sends a notice of transfer completion of the FOUP 3, the transport-related control unit 25 will send through the transport-related control unit 31 to the carrier transport system 7 a request for loading the following (second) FOUP 3. Thus, transportation to the physical load port R-LP1 of the second FOUP 3 is carried out promptly in a short time following the first FOUP 3.

Even if the start of loading of the next (second) FOUP 3 is suspended as described above, compared with the conventional substrate treating system in which instructions for loading the next (second) FOUP 3 are given only after the preceding FOUP 3 is taken into the internal buffer 15, making the physical load port R-LP1 available for the next loading, this invention, with the transportation of the next (second) FOUP 3 started early, can carry out a more efficient transportation despite such an idle situation than the prior art.

This invention is not limited to the foregoing embodiments, but may be modified as follows:

(1) In the unloading process in the foregoing embodiments, a readiness for unloading is reported at a point of time when the substrate treating apparatus 5 begins to unload a FOUP 3 from the internal buffer 15 to the load port 13. However, a readiness for unloading may be reported during a period of time from when the substrate treating apparatus 5 begins to unload a FOUP 3 from the internal buffer 15 to the load port 13, to the time the FOUP 3 is actually placed on the load port 13. Whenever such report is made during this period, the time when the carrier transport system starts movement can be advanced to be earlier than in the prior art.

(2) In the foregoing embodiment, the carrier transport system 7 is illustrated as having OHTs 17. These may be replaced with AGVs (Automatic Guided Vehicles).

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating system comprising:
a substrate treating apparatus having a substrate treating unit for carrying out predetermined treatments of substrates, a load port with physical load ports for receiving pods for storing the substrates, the load port transferring the pods to and from the substrate treating unit, and an internal buffer interposed between the substrate treating unit and the load port for transferring the substrates to and from the substrate treating unit, transferring the pods to and from the load port, and temporarily storing the pods in time of transfer;
a carrier transport system for transferring the pods to and from the load port; and
a host computer for communicating with the substrate treating apparatus and the carrier transport system, and instructing the carrier transport system to transport the pods according to a situation of the substrate treating apparatus;
wherein the substrate treating apparatus includes a transport-related control unit arranged, when the load port is being used by one of the pods and a vehicle of the carrier transport system approaches to transfer another of the pods to the load port, to suspend a notice of transfer disapproval until completion of the use by the one of the pods.

2. The substrate treating system according to claim 1, wherein the carrier transport system is arranged, when, in time of loading, a different one of the pods is present on the load port, to stand by in a current position until permission for loading is obtained from the transport-related control unit.

3. The substrate treating system according to claim 1, wherein the substrate treating apparatus further includes a host-related control unit arranged, when instructed by the host computer to unload a pod in the internal buffer, to report to the host computer that the pod is ready for unloading, during a period of time from a start of transportation of the pod from the internal buffer to the load port until the pod is placed on the load port.

4. The substrate treating system according to claim 2, wherein the substrate treating apparatus further includes a host-related control unit arranged, when instructed by the host computer to unload a pod in the internal buffer, to report to the host computer that the pod is ready for unloading, during a period of time from a start of transportation of the pod from the internal buffer to the load port until the pod is placed on the load port.

5. The substrate treating system according to claim 3, wherein the carrier transport system is arranged, when the vehicle has moved to unload the pod but fails to find the pod on the load port, to cause the vehicle to stand by in a current position until the pod is placed on the load port.

6. The substrate treating system according to claim 4, wherein the carrier transport system is arranged, when the vehicle has moved to unload the pod but fails to find the pod on the load port, to cause the vehicle to stand by in a current position until the pod is placed on the load port.

7. A substrate treating system comprising:
a substrate treating apparatus having a substrate treating unit for carrying out predetermined treatments of substrates, a load port with physical load ports for receiving pods for storing the substrates, the load port transferring the pods to and from the substrate treating unit, and an internal buffer interposed between the substrate treating unit and the load port for transferring the substrates to and from the substrate treating unit, transferring the pods to and from the load port, and temporarily storing the pods in time of transfer;
a carrier transport system for transferring the pods to and from the load port; and
a host computer for communicating with the substrate treating apparatus and the carrier transport system, and instructing the carrier transport system to transport the pods according to a situation of the substrate treating apparatus;
wherein the substrate treating apparatus includes a host-related control unit arranged, when instructed by the host computer to unload a pod in the internal buffer, to report to the host computer that the pod is ready for unloading, during a period of time from a start of transportation of the pod from the internal buffer to the load port until the pod is placed on the load port.

8. The substrate treating system according to claim 1, further comprising a virtual load port control device for allotting virtual load ports to the physical load ports, and instructing the carrier transport system to perform a transporting operation to and from the virtual load ports on an assumption that the virtual load ports really exist.

9. The substrate treating system according to claim 2, further comprising a virtual load port control device for allotting virtual load ports to the physical load ports, and instructing the carrier transport system to perform a transporting operation to and from the virtual load ports on an assumption that the virtual load ports really exist.

10. The substrate treating system according to claim 3, further comprising a virtual load port control device for allotting virtual load ports to the physical load ports, and instructing the carrier transport system to perform a transporting operation to and from the virtual load ports on an assumption that the virtual load ports really exist.

11. The substrate treating system according to claim 4, further comprising a virtual load port control device for allotting virtual load ports to the physical load ports, and instructing the carrier transport system to perform a transporting operation to and from the virtual load ports on an assumption that the virtual load ports really exist.

12. The substrate treating system according to claim 5, further comprising a virtual load port control device for allotting virtual load ports to the physical load ports, and instructing the carrier transport system to perform a transporting operation to and from the virtual load ports on an assumption that the virtual load ports really exist.

13. The substrate treating system according to claim 6, further comprising a virtual load port control device for allotting virtual load ports to the physical load ports, and instructing the carrier transport system to perform a transporting operation to and from the virtual load ports on an assumption that the virtual load ports really exist.

14. The substrate treating system according to claim 7, further comprising a virtual load port control device for allotting virtual load ports to the physical load ports, and instructing the carrier transport system to perform a transporting operation to and from the virtual load ports on an assumption that the virtual load ports really exist.

15. The substrate treating system according to claim 3, wherein the host-related control unit is arranged to report to the host computer that the pod is ready for unloading, at a point of time when the transportation of the pod from the internal buffer to the load port is started.

16. The substrate treating system according to claim 4, wherein the host-related control unit is arranged to report to the host computer that the pod is ready for unloading, at a point of time when the transportation of the pod from the internal buffer to the load port is started.

17. The substrate treating system according to claim 7, wherein the host-related control unit is arranged to report to the host computer that the pod is ready for unloading, at a point of time when the transportation of the pod from the internal buffer to the load port is started.

* * * * *